US008758880B2

(12) United States Patent
Flores et al.

(10) Patent No.: US 8,758,880 B2
(45) Date of Patent: Jun. 24, 2014

(54) KETOPYRROLES AS ORGANIC SEMICONDUCTORS

(75) Inventors: Jean-Charles Flores, Mulhouse (FR); Ulrich Berens, Binzen (DE); Frank Bienewald, Hegenheim (FR); Hans Jürg Kirner, Basel (CH); Mathieu G. R. Turbiez, Rixheim (FO)

(73) Assignee: BASF SE, Ludwigshafen (DE)

( * ) Notice: Subject to any disclaimer, the term of this patent is extended or adjusted under 35 U.S.C. 154(b) by 1047 days.

(21) Appl. No.: 12/680,920

(22) PCT Filed: Oct. 16, 2008

(86) PCT No.: PCT/EP2008/063919
§ 371 (c)(1),
(2), (4) Date: Jul. 22, 2010

(87) PCT Pub. No.: WO2009/053291
PCT Pub. Date: Apr. 30, 2009

(65) Prior Publication Data
US 2010/0297405 A1 Nov. 25, 2010

(30) Foreign Application Priority Data

Oct. 25, 2007 (EP) .................................. 07119283

(51) Int. Cl.
*H01L 35/24* (2006.01)
(52) U.S. Cl.
USPC .......... 428/195.1; 257/40; 526/258; 548/453; 548/457; 548/460; 548/466; 548/486; 548/519
(58) Field of Classification Search
USPC .......... 428/195.1; 257/40; 526/258; 548/453, 548/457, 460, 466, 486, 519
See application file for complete search history.

(56) References Cited

U.S. PATENT DOCUMENTS

| 3,185,590 | A | * | 5/1965 | Mayer et al. | 429/336 |
| 4,395,497 | A | * | 7/1983 | Naarmann et al. | 523/135 |
| 4,468,291 | A | * | 8/1984 | Naarmann et al. | 205/77 |
| 4,535,039 | A | * | 8/1985 | Naarmann et al. | 429/213 |
| 4,609,600 | A | * | 9/1986 | Heinze et al. | 429/337 |
| 2009/0302311 | A1 | | 12/2009 | Turbiez et al. | |

FOREIGN PATENT DOCUMENTS

| DE | 4011347 A1 * | 10/1991 |
| EP | 1 078 970 A | 2/2001 |
| JP | 04008731 A * | 1/1992 |
| WO | 2005/049695 A | 6/2005 |
| WO | 2008/000664 A | 1/2008 |

OTHER PUBLICATIONS

Machine translation of detailed description of DE 4011347 acquired Aug. 7, 2013.*
Chan W-K et al: "Rational Designs of Multifunctional Polymers" Journal of the American Chemical Society, American Chemical Society, Washington, DC.; US, US, vol. 115, No. 25, Jan. 1, 1993, pp. 11735-11743, XP000652156 ISSN: 0002-7863.

* cited by examiner

*Primary Examiner* — Gerard Higgins
(74) *Attorney, Agent, or Firm* — Shruti Costales

(57) ABSTRACT

Monomeric or polymeric compounds comprising at least one moiety of the formula (Ia) wherein X is CR, where R is H or a substituent as defined in claim 1, or is another ketopyrrole moiety e.g. of the formula (Ib) or (Ic) with this moiety and all other symbols are as defined in claim 1, show good solubility in organic solvents and excellent film-forming properties. In addition, high efficiency of energy conversion, excellent field-effect mobility, good on/off current ratios and/or excellent stability can be observed, when the polymers according to the invention are used in semiconductor devices or organic photovoltaic (PV) devices (solar cells).

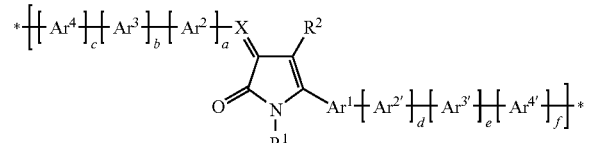

(Ia)

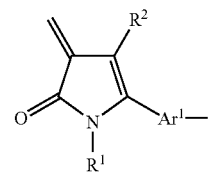

(Ib)

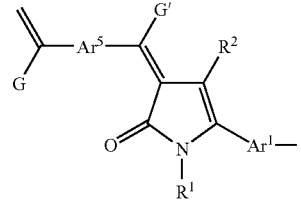

(Ic)

10 Claims, No Drawings

KETOPYRROLES AS ORGANIC SEMICONDUCTORS

The present invention relates to novel semiconductors containing a ketopyrrole of the formula (I), and to a corresponding device such as a diode, photodiode and especially an organic field effect transistor and/or photovoltaic cell containing the novel semiconductor, or a device containing a diode and/or a photodiode and/or an organic field effect transistor, and/or a solar cell. The novel semiconductors according to the invention have excellent solubility in organic solvents and excellent film-forming properties. In addition, high efficiency of energy conversion, excellent field-effect mobility, good on/off current ratios and/or excellent stability can be observed, when the compounds according to the invention are used in semiconductor devices or organic photovoltaic (PV) devices (solar cells).

A number of publications (e.g. WO05/049695, WO08/000664) describe certain diketopyrrolopyrrole (DPP) based polymers and their use in electronic applications including PLEDs, organic integrated circuits (O-ICs), organic field effect transistors (OFETs), organic thin film transistors (OT-FTs), organic solar cells (O-SCs), or organic laser diodes.

The object of the present invention is to provide novel organic semiconducting materials which show excellent performance when used, for example, in semiconductor devices, photodiodes, organic field effect transistors (OFETs) or organic photovoltaic (PV) devices (solar cells), such as high efficiency of energy conversion, excellent field-effect mobility, good on/off current ratios and/or excellent stability especially against oxidation.

Said object is achieved by employing a ketopyrrole compound of the formula (I), or a corresponding oligomer or polymer comprising repeating units of the formula (Ia) (in the following also recalled as polymer(s) of the formula (1a), or compound(s) of the formula (1a))

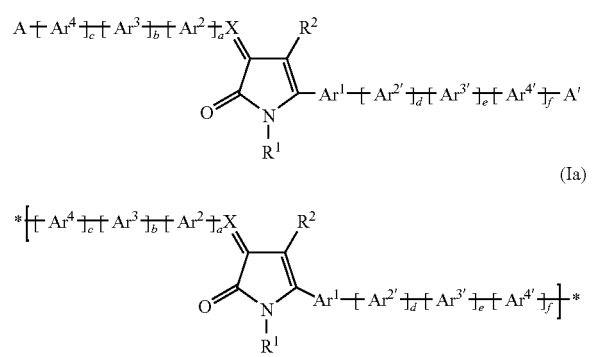

wherein a, b, c, d, e and f are from the range 0-3;
each of A, A', $R^1$, $R^2$ independently are selected from hydrogen; E; $C_1$-$C_{25}$alkyl, $C_2$-$C_{25}$alkenyl, $C_2$-$C_{24}$alkynyl, each of which may optionally be substituted by E and/or in any C,C-single bond, if present, interrupted by D; a cycloalkyl group, which can be substituted by E, especially one to three times by $C_1$-$C_8$alkyl, $C_1$-$C_8$thioalkoxy, or $C_1$-$C_8$alkoxy; or a cycloalkyl group, which can be condensed one or two times by unsubstituted phenyl or phenyl substituted by E, especially phenyl substituted one to three times by $C_1$-$C_4$-alkyl, halogen, nitro or cyano; a cycloalkenyl group; a ketone or aldehyde group; an ester group; a carbamoyl group; a silyl group; a siloxanyl group; $Ar^{10}$ or —$CR^5R^6$—$(C_jH_{2j})$—$Ar^{10}$, where j stands for 0, 1, 2, 3 or 4;
or $R^2$ and $Ar^1$, together with the vinyl moiety they are bonding to, form a ring such as an aryl or heteroaryl group, which may optionally be substituted by G;
X is CR where R is as defined for $R^1$, or is another ketopyrrole moiety of the formula (Ib)

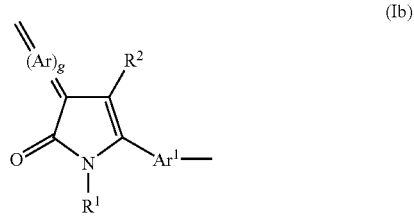

the index g is 0 or 1 and Ar, if present, is a tetravalent residue connected to the rest of the molecule by 2 chemical double bonds, and is selected from quinoid $C_6$-$C_{10}$ring systems, such as =$C_6H_4$=, and residues of the formula

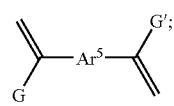

$Ar^1$, if not linked to $R^2$, and $Ar^2$, $Ar^{2'}$, $Ar^3$, $Ar^{3'}$, $Ar^4$, $Ar^{4'}$ and $Ar^5$ independently of each other are selected from divalent carbocyclic moieties of 5 to 15 carbon atoms, divalent heterocyclic moieties of 2 to 15 carbon and 1-8 heteroatoms selected from O, N, S, Si, each of said moieties containing conjugated or cross-conjugated double and/or triple bonds, or ethylenic or ethinic moieties, where each of these moieties is unsubstituted or substituted by E;
$R^5$ and $R^6$ independently from each other stand for hydrogen, fluorine, cyano or $C_1$-$C_4$alkyl, which can be substituted by fluorine, chlorine or bromine, or phenyl, which can be substituted one to three times with $C_1$-$C_4$alkyl,
$Ar^{10}$ stands for aryl or heteroaryl, which may optionally be substituted by G, in particular phenyl or 1- or 2-naphthyl which can be substituted one to three times with $C_1$-$C_8$alkyl, $C_1$-$C_8$thioalkoxy, and/or $C_1$-$C_8$alkoxy;
D is —CO—; —COO—; —S—; —SO—; —SO$_2$—; —OP(O)(OR$^{29}$)O—; —OP(O)(R$'^{29}$)O—; —O—; —NR$^{25}$—; —CR$^{23}$=CR$^{24}$—; or —C≡C—; and
E is —OR$^{29}$; —SR$^{29}$; —SOR$^{29}$; —SO$_2$R$^{29}$; —NR$^{25}$R$^{26}$; —COR$^{28}$; —COOR$^{27}$; —CONR$^{25}$R$^{26}$; —CN; nitro; —OP(O)(OR$^{28}$)$_2$; —OP(O)(R$'^{29}$)$_2$; —Si(R$'^{29}$)$_3$; or halogen;
G and G' independently are E; $C_1$-$C_{18}$alkyl, which may be interrupted by D; or $C_1$-$C_{18}$alkoxy which is substituted by E and/or, if containing 2 or especially more carbon atoms, interrupted by D, wherein
$R^{23}$, $R^{24}$, $R^{25}$ and $R^{26}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—;
$R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—;

$R'^{29}$ is as defined for $R^{29}$ except that $R'^{29}$ is not H;

or a tautomer of such a compound, oligomer or polymer.

The polymers of the invention may contain structures of the invention (Ia) in a statistical or non-statistical manner. End groups of polymers as defined by their preparation, e.g. Suzuki-polymerization, may be altered according to methods commonly known in the art if desired. Similarly, grafting reactions may be carried out.

Since X forms, together with the rest of the molecule, in most cases an unsymmetrical residue, this may be attached in trans- or cis-mode, thus including corresponding isomers such as in formulae IIIc and IIId (trans) or IIIe and IIIf (cis):

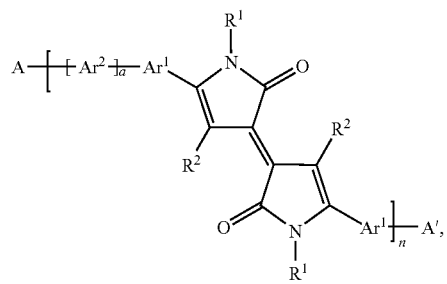
(IIIc)

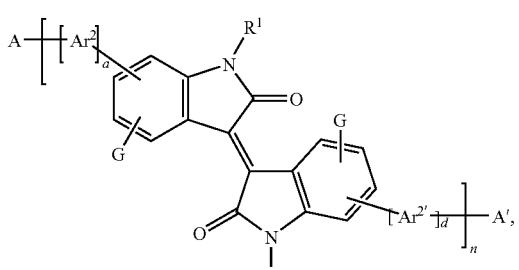
(IIId)

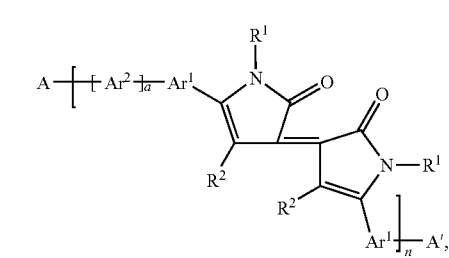
(IIIe)

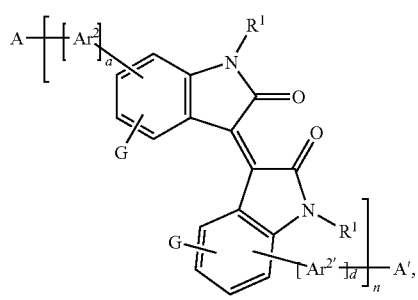
(IIIf)

where n ranges, for example, from 1 to 10000, and other symbols are as defined elsewhere.

Examples for bridging groups of the above the formula (Ib) include those of the formulae

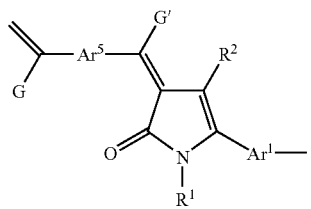
(Ic)

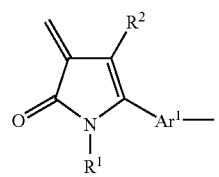
(Id)

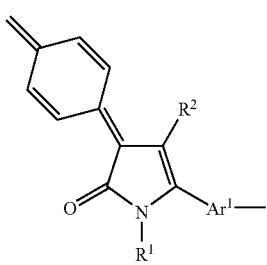
(Ie)

Further examples for Ar as a quinoid $C_6$-$C_{10}$ system analogous to the one in formula (1e) include corresponding naphthoquinoline-derived residues and substituted variants, where substituents are, for example, selected from those listed above for $R^2$.

More specifically, semiconductor devices of the invention may comprise compounds of formulae (I) and/or (Ia) wherein $Ar^1$, if not linked to $R^2$, as well as $Ar^2$, $Ar^{2'}$, $Ar^3$, $Ar^{3'}$, $Ar^4$, $Ar^{4'}$ and $Ar^5$ are independently of each other selected from

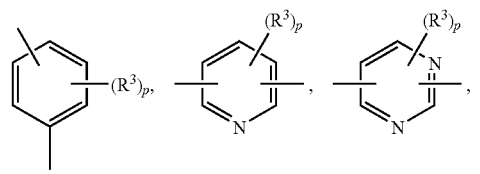

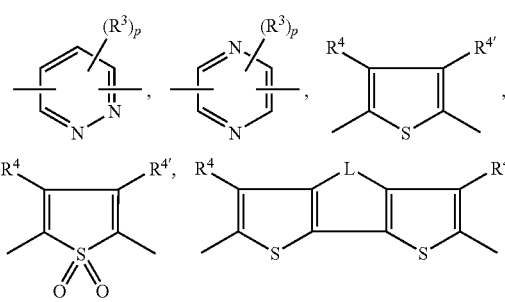

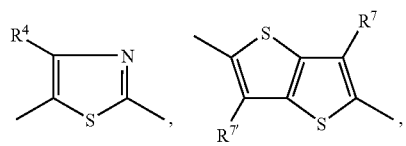

-continued

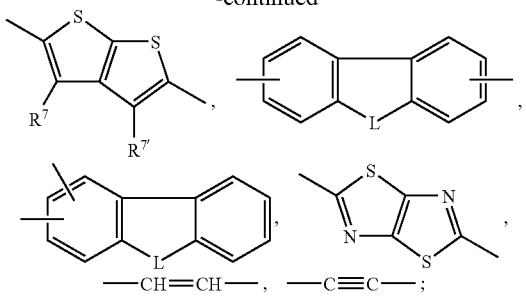

especially

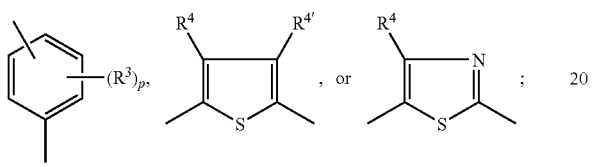

wherein L is selected from $CR^7R'^7$, $C=O$, $C=NR^7$, O, S, $NR^7$, $SiR^{17}R'^{17}$;

$R^3$ may be the same or different within one group and is selected from hydrogen, a residue E, $C_1$-$C_{25}$alkyl, which may optionally be substituted by E and/or, if containing 2 or especially more carbon atoms, interrupted by D, $C_6$-$C_{24}$aryl, which may optionally be substituted by G, $C_2$-$C_{20}$heteroaryl, which may optionally be substituted by G, $C_1$-$C_{18}$alkoxy, which may optionally be substituted by E and/or, if containing 2 or especially more carbon atoms, interrupted by D, $C_7$-$C_{25}$aralkyl, wherein ar (=aryl) of aralkyl may optionally be substituted by G, or —CO—$R^{28}$, or two or more groups $R^3$ which are in the neighbourhood to each other, form a ring;

$R^4$, $R^{4'}$, $R^7$ and $R^{7'}$ independently from each other stand for hydrogen, a residue E, $C_1$-$C_{25}$alkyl, which may optionally be substituted by E and/or, if containing 2 or especially more carbon atoms, interrupted by D, $C_6$-$C_{24}$aryl, which may optionally be substituted by G, $C_2$-$C_{20}$heteroaryl, which may optionally be substituted by G, $C_1$-$C_{18}$alkoxy, which may optionally be substituted by E and/or, if containing 2 or especially more carbon atoms, interrupted by D, $C_7$-$C_{25}$aralkyl, wherein ar (=aryl) of aralkyl may optionally be substituted by G, or —CO—$R^{28}$; or $R^4$ and $R^{4'}$ form a ring,
and $R^{17}$ and $R'^{17}$ are as defined as $R^{29}$, especially as $R'^{29}$;
such as those wherein each aryl and heteroaryl is selected from phenyl and thiophenyl.

Preferred semiconductor devices contain compounds wherein A and A' are independently selected from hydrogen; $C_1$-$C_{25}$alkyl or $C_2$-$C_{25}$alkenyl, each of which may optionally be substituted by E and/or in a C,C-single bond, if present, interrupted by D; $Ar^{10}$ or —$CR^5R^6$—$(CH_2)_j$—$Ar^{10}$;
$Ar^{10}$ is selected from phenyl and thiophenyl;
D is —S—; —O—; —$CR^{23}$=$CR^{24}$—; and
E is —$OR^{29}$; —$SR^{29}$; —$NR^{25}R^{26}$—; —CN; or halogen;
G and G' independently are E; $C_1$-$C_{18}$alkyl, which may be interrupted by D; or $C_1$-$C_{18}$alkoxy which is substituted by E and/or, if containing 2 or especially more carbon atoms, interrupted by D, wherein $R^{23}$, $R^{24}$, $R^{25}$ and $R^{26}$ are independently of each other H; phenyl; thiophenyl; phenyl or thiophenyl which is substituted by $C_1$-$C_{18}$alkyl, or $C_1$-$C_{18}$alkoxy; $C_1$-$C_{18}$alkyl;

$R^{29}$ is H; phenyl; thiophenyl; phenyl or thiophenyl, which is substituted by $C_1$-$C_{18}$alkyl or $C_1$-$C_{18}$alkoxy; $C_1$-$C_{18}$alkyl;

$R'^{29}$ is as defined for $R^{29}$ except that $R'^{29}$ is not H.

Examples for such compounds of the formula (I) or (Ia) are those conforming to the formula (IIa), (IIb), (IIc) or (IId)

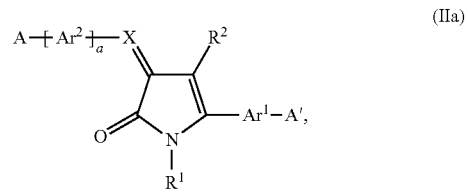
(IIa)

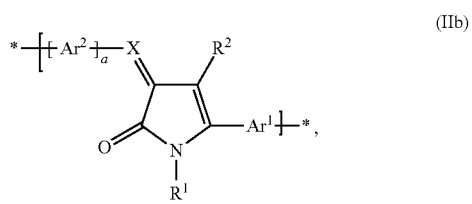
(IIb)

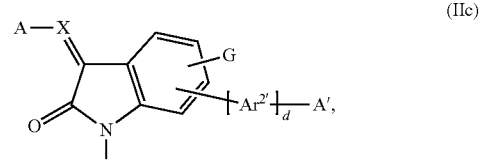
(IIc)

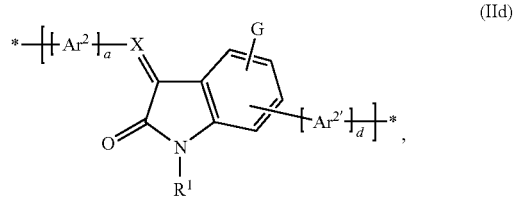
(IId)

with symbols as defined above,
or to the formula (IIe) or (IIf)

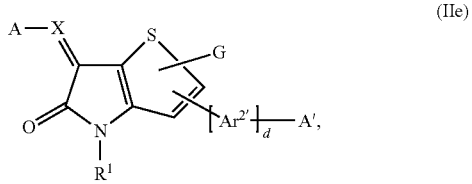
(IIe)

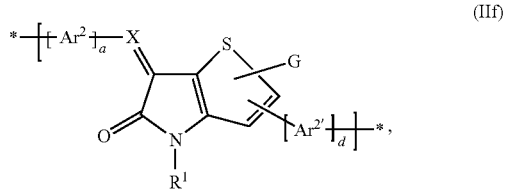
(IIf)

or especially to the formula (IIIa) or (IIIb)

(IIIa)
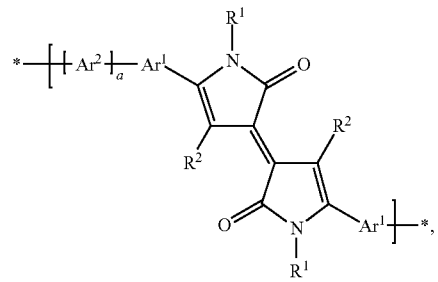

(IIIb)
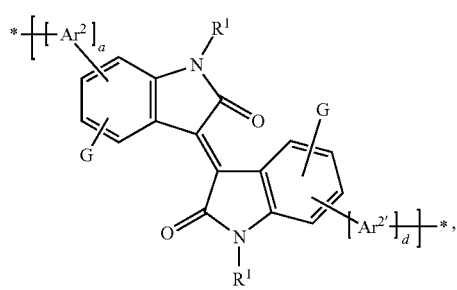

with symbols as defined above.

Moieties A, A' usually form the end groups of the homooligomer or homopolymer chain in formula (1a); these groups A, A' are preferably selected from hydrogen; $C_1$-$C_{25}$alkyl or $C_2$-$C_{25}$alkenyl, each of which may optionally be substituted by E and/or in a C,C-single bond, if present, interrupted by D; $Ar^{10}$ or —$CR^5R^6$—$(CH_2)_j$—$Ar^{10}$;

where $R^5$ and $R^6$ independently from each other stand for hydrogen, fluoro, or $C_1$-$C_4$alkyl which can be substituted by fluoro, and
$Ar^{10}$ stands for a group of formula

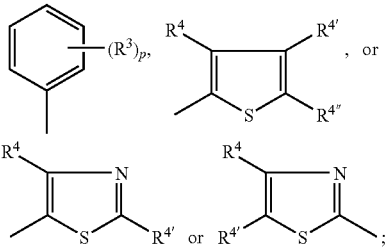

where
p stands for 0, 1, 2, or 3;
$R^3$ may be the same or different within one group and is selected from $C_1$-$C_{18}$alkyl, $C_1$-$C_{18}$alkoxy, each of which may be substituted by E; or is —CO—$R^{28}$; or two or more groups $R^3$ which are in the neighbourhood to each other, form an annelated, 5 or 6 membered carbocyclic ring;
$R^4$, $R^{4'}$ and $R^{4''}$ independently stand for hydrogen, $C_1$-$C_{25}$alkyl, which may optionally be substituted by E and/or, if containing 2 or especially more carbon atoms, interrupted by D;
$C_1$-$C_{18}$alkoxy, which may optionally be substituted by E and/or, if containing 2 or especially more carbon atoms, interrupted by D; $C_7$-$C_{15}$phenylalkyl, wherein phenyl may optionally be substituted by G, or —CO—$R^{28}$.

Examples for important oligomers and polymers of the invention are those wherein the moiety of formula Ia conforms to formula IVa-IVi:

(IVa)
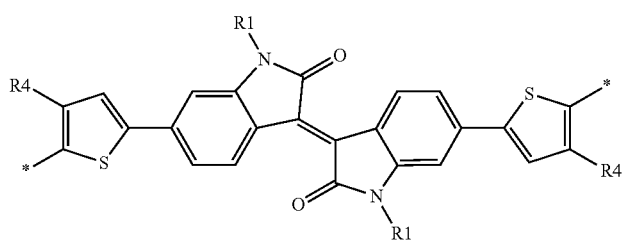

(IVb)
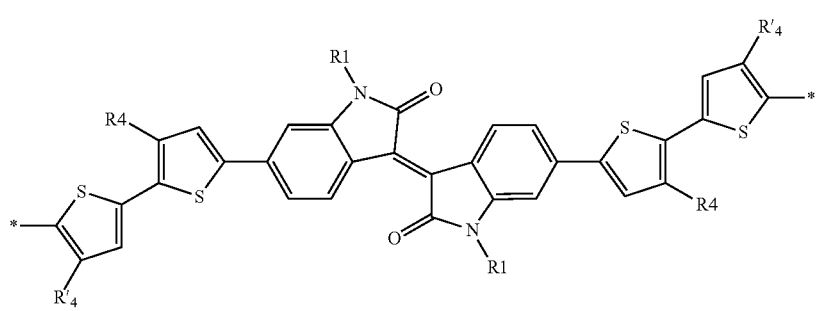

(IVc)
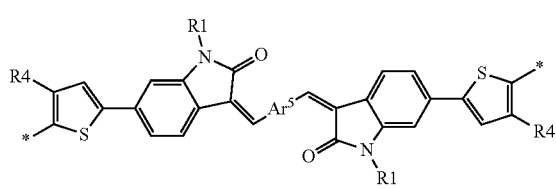

(IVd)
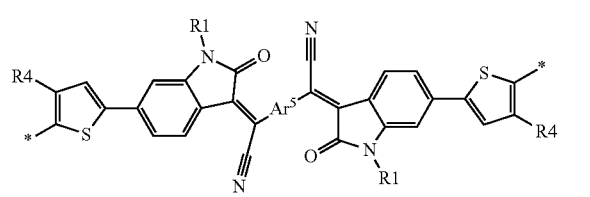

-continued

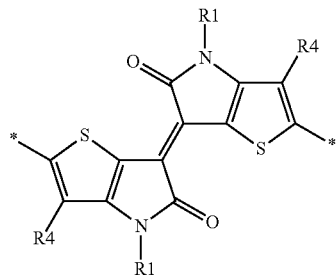
(IVe)

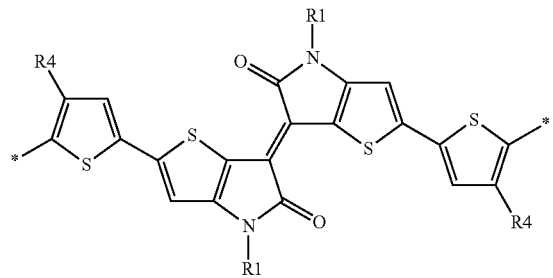
(IVf)

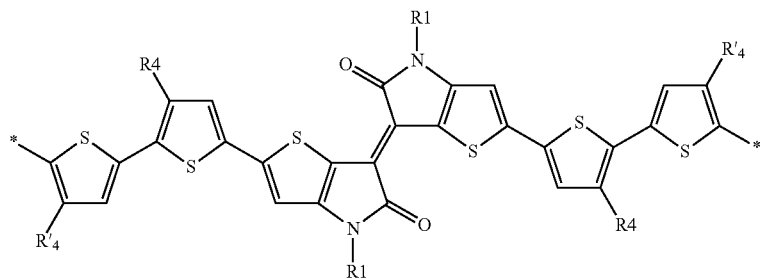
(IVg)

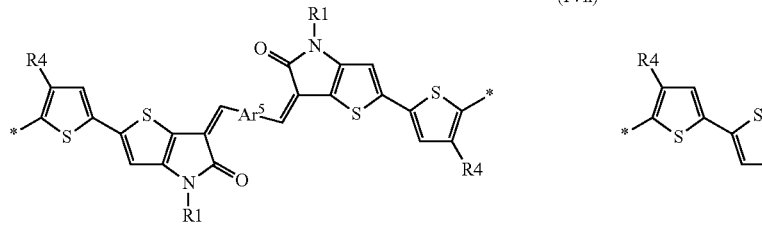
(IVh)

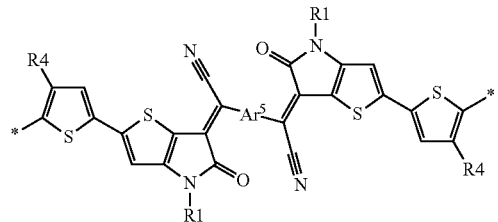
(IVi)

wherein the symbols are as defined above, especially wherein each of R1 and R4 are selected from hydrogen and $C_1$-$C_{22}$alkyl and $Ar^5$ is phenylene or

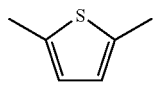

each of which optionally may be substituted by G such as $C_1$-$C_{22}$alkyl or CN.

The polymers of the present invention can be used as charge-transport, semiconducting, el. conducting, photoconducting, light emitting material, surface-modifying material, electrode materials in batteries, alignment layers, or in OFETs, ICs, TFTs, displays, RFID tags, electro- or photoluminescent devices, backlights of displays, photovoltaic or sensor devices, charge injection layers, Schottky diodes, memory devices (e.g. FeFET), planarising layers, antistatics, conductive substrates or patterns, photoconductors, or electrophotographic applications (recording).

The polymers of the present invention can comprise one, or more (different) repeating units of formula Ia, such as, for example, repeating units of formula IVa and IVd.

The compound of formula I and the repeating unit of formula Ia can have an asymmetric structure, but preferably has a symmetric structure, wherein a=d; b=e; c=f; $Ar^1$=$Ar^1$; $Ar^2$=$Ar^2$; $Ar^3$=$Ar^3$; $Ar^4$=$Ar^4$.

$R^1$ and $R^2$ may be the same or different and are preferably selected from hydrogen, a $C_1$-$C_{25}$alkyl group, which can optionally be interrupted by one or more oxygen atoms, a $C_1$-$C_{25}$ perfluoroalkyl group, an allyl group, which can be substituted one to three times with $C_1$-$C_4$alkyl; a cycloalkyl group, which can be substituted one to three times with $C_1$-$C_8$alkyl, $C_1$-$C_8$thioalkoxy, or $C_1$-$C_8$alkoxy, or a cycloalkyl group, which can be condensed one or two times by phenyl, which can be substituted one to three times with $C_1$-$C_4$-alkyl, halogen, nitro or cyano, an alkenyl group, a cycloalkenyl group, an alkynyl group, a haloalkyl group, a haloalkenyl group, a haloalkynyl group, a ketone or aldehyde group, an ester group, a carbamoyl group, a ketone group, a silyl group, a siloxanyl group, $Ar^{10}$ or —$CR^5R^6$—$(CH_2)_j$—$Ar^{10}$, wherein
$R^5$ and $R^6$ independently from each other stand for hydrogen, fluorine, cyano or $C_1$-$C_4$alkyl, which can be substituted by fluorine, chlorine or bromine, or phenyl, which can be substituted one to three times with $C_1$-$C_4$alkyl, $R^1$ and $R^2$ are more preferably selected from $C_1$-$C_{25}$alkyl, which can optionally be interrupted by one or more oxygen atoms, $C_5$-$C_{12}$-cycloalkyl, especially cyclohexyl, which can be substituted one to three times with $C_1$-$C_8$alkyl and/or $C_1$-$C_8$alkoxy, or $C_5$-$C_{12}$-cycloalkyl, especially cyclohexyl, which can be condensed one or two times by phenyl, which can be substituted one to three times with $C_1$-$C_4$-alkyl, halogen, nitro or cyano, phenyl or 1- or 2-naphthyl which can be substituted one to three times with $C_1$-$C_8$alkyl and/or $C_1$-$C_8$alkoxy, or —$CR^5R^6$—$(CH_2)_j$—$Ar^{10}$ wherein $R^3$ and $R^4$ stand for hydrogen, $Ar^{10}$ stands for phenyl or 1- or 2-naphthyl, which can be substituted one to three times with $C_1$-$C_8$alkyl and/or $C_1$-$C_8$alkoxy, and j stands for 0 or 1. An alkyl group which is interrupted one or more times by —O— is understood to be a straight-chain or branched $C_2$-$C_{25}$alkyl radical, which may be interrupted one or more times by —O—, for example one, two or three times by —O—, resulting in structural units such as, for example, —(CH$_2$)$_2$OCH$_3$, —(CH$_2$CH$_2$O)$_2$CH$_2$CH$_3$, —CH$_2$—O—CH$_3$, —CH$_2$CH$_2$—O—CH$_2$CH$_3$, —CH$_2$CH$_2$CH$_2$—O—CH(CH$_3$)$_2$, —[CH$_2$CH$_2$O]$_{Y1}$—CH$_3$ wherein Y1=1-10, —CH$_2$—CH(CH$_3$)—O—CH$_2$—CH$_2$CH$_3$ and —CH$_2$—CH(CH$_3$)—O—CH$_2$—CH$_3$.

Most preferred R$^1$ and R$^2$ are a C$_1$-C$_{25}$alkyl group, especially a C$_4$-C$_{25}$alkyl group, such as n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl, n-nonyl, n-decyl, n-undecyl, n-dodecyl, tridecyl, tetradecyl, pentadecyl, hexadecyl, 2-hexyldecyl, heptadecyl, octadecyl, eicosyl, heneicosyl, docosyl, tetracosyl or pentacosyl, wherein advantageous groups can be represented by formula

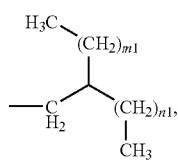

wherein m1=n1+2 and m1+n1≤22.

Chiral side chains, such as R$^1$ and R$^2$, can either be homochiral, or racemic, which can influence the morphology of the polymers.

Ar$^1$ and Ar$^{1'}$ can be different, but are preferably the same and are a group of formula

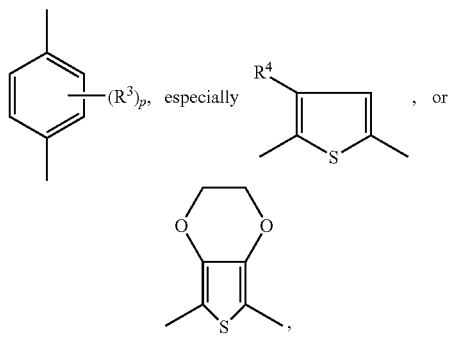

and
Ar$^2$, Ar$^{2'}$, Ar$^3$, Ar$^{3'}$, Ar$^4$ and Ar$^{4'}$ are independently of each other a group of formula

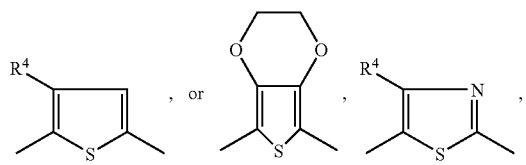

wherein
p stands for 0, 1, or 2, R$^3$ may be the same or different within one group and is selected from C$_1$-C$_{25}$alkyl, which may optionally be substituted by E and/or interrupted by D, or C$_1$-C$_{18}$alkoxy, which may optionally be substituted by E and/or interrupted by D; R$^4$ is C$_6$-C$_{25}$alkyl, which may optionally be substituted by E and/or interrupted by D, C$_6$-C$_{14}$aryl, such as phenyl, naphthyl, or biphenylyl, which may optionally be substituted by G, C$_1$-C$_{25}$alkoxy, which may optionally be substituted by E and/or interrupted by D, or C$_7$-C$_{15}$aralkyl, wherein ar may optionally be substituted by G, D is —CO—, —COO—, —S—, —SO—, —SO$_2$—, —O—, —NR$^{25}$—, wherein R$^{25}$ is C$_1$-C$_{12}$alkyl, such as methyl, ethyl, n-propyl, iso-propyl, n-butyl, isobutyl, or sec-butyl;

E is —OR$^{29}$; —SR$^{29}$; —NR$^{25}$R$^{25}$; —COR$^{28}$; —COOR$^{27}$; —CONR$^{25}$R$^{25}$; or —CN; wherein R$^{25}$, R$^{27}$, R$^{28}$ and R$^{29}$ are independently of each other C$_1$-C$_{12}$alkyl, such as methyl, ethyl, n-propyl, iso-propyl, n-butyl, isobutyl, sec-butyl, hexyl, octyl, or 2-ethyl-hexyl, or C$_6$-C$_{14}$ aryl, such as phenyl, naphthyl, or biphenylyl, G has the same preferences as E, or is C$_1$-C$_{18}$alkyl, especially C$_1$-C$_{12}$alkyl, such as methyl, ethyl, n-propyl, iso-propyl, n-butyl, isobutyl, sec-butyl, hexyl, octyl, or 2-ethyl-hexyl.

The units

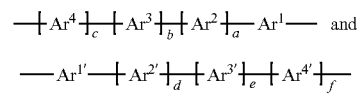

may be different, but are preferably the same and are a group of formula

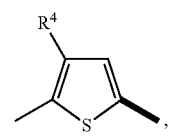

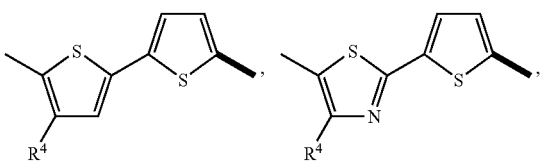

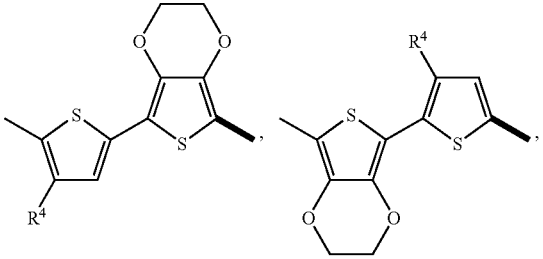

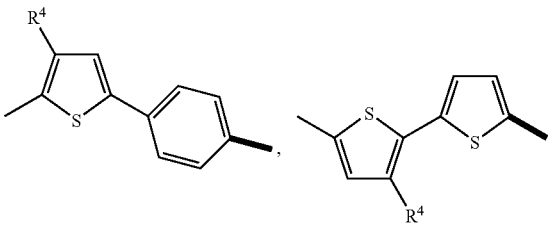

-continued

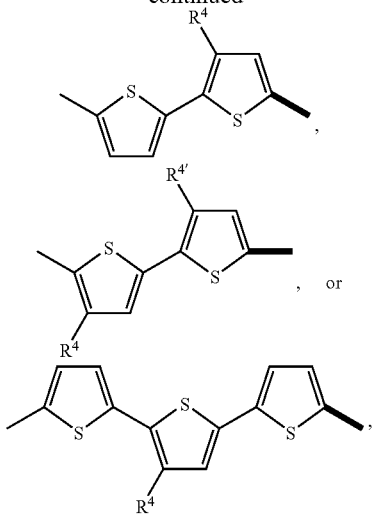

wherein

■ indicates the bond to the ketopyrrole skeleton, and $R^4$ is as defined above and $R^{4'}$ has the meaning of $R^4$.

In another preferred embodiment of the present invention the units

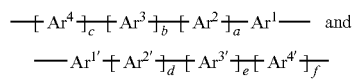

may be different, but are preferably the same and are a group of formula

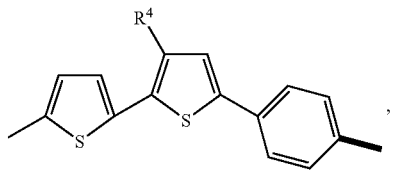

wherein $R^4$ is $C_6$-$C_{25}$alkyl, which may optionally be interrupted by one or more oxygen atoms; or $Ar^5$ is a group of formula

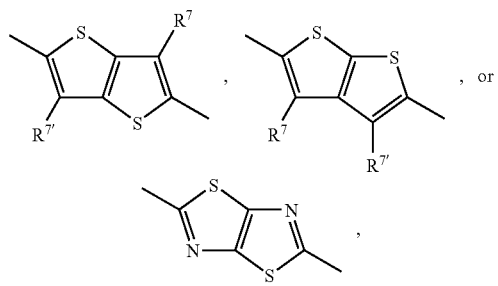

wherein $R^7$ and $R^{7'}$ are as defined above; or
the polymer has the structure of formula $$*-[\text{First Repeating Unit}]_q-[\text{Branching Unit}]_t-*, \quad (III)$$

wherein the First "Repeating Unit" is a repeating unit of formula (Ia),
the "Branching Unit" is a unit having more than two linkage sites, and
q and t are integers, wherein q/t is the ratio of the repeating unit of formula (Ia) to the "Branching Unit".

In another preferred embodiment of the present invention the polymer has the structure of formula $$*-[\text{First Repeating Unit}]_q-[\text{Branching Unit}]_t-*, \quad (V)$$

wherein the First "Repeating Unit" is a repeating unit of formula Ia,
the "Branching Unit" is a unit having more than two linkage sites, and
q and t are integers, wherein q/t is the ratio of the repeating unit of formula Ito the "Branching Unit".

The repeating unit of formula (Ia) has advantageously a symmetric structure: a=d; b=e; c=f; $Ar^1$=$Ar^1$; $Ar^2$=$Ar^{2'}$; $Ar^3$=$Ar^{3'}$; $Ar^4$=$Ar^{4'}$.

The "Branching Unit" is a unit having more than two linkage sites. Examples of branching units are, for example, described in Dendrimers and Other Dendritic Polymers, D. A. Tomalia, J. M. J. Fréchet (Eds), John Wiley & Sons, Ltd. 2002; Star and Hyperbranched Polymers, M. K. Mishra and S. Kobayashi (Eds), Marcel Dekker 2000.

Examples of especially suitable "Branching" Units are shown below:

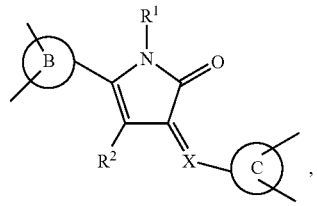

wherein B and C are independently of each other an optionally condensed aromatic, or heteroaromatic ring, such as

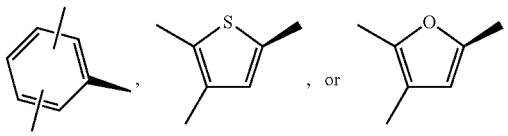

is the bonding to the compound/polymer backbone, especially
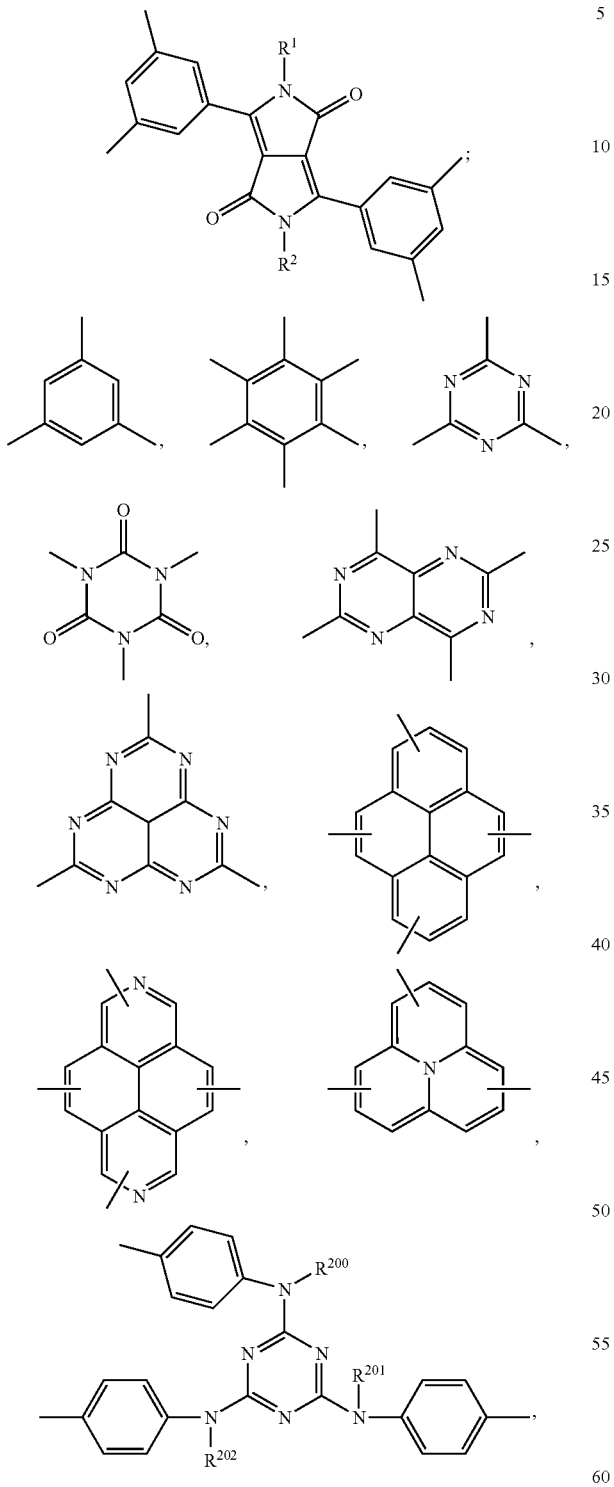
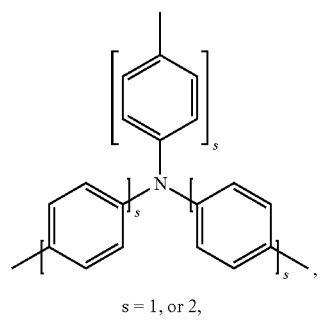
s = 1, or 2,
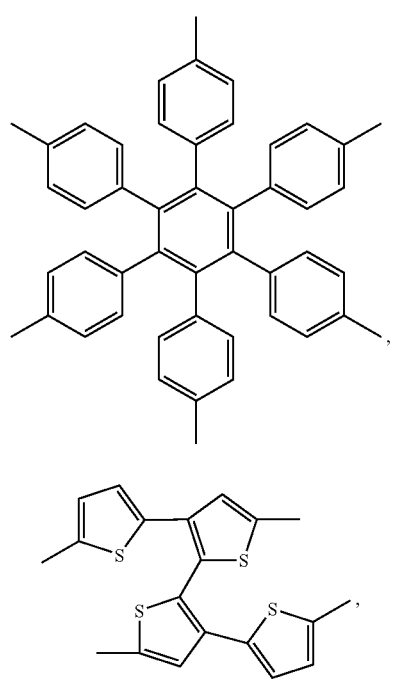
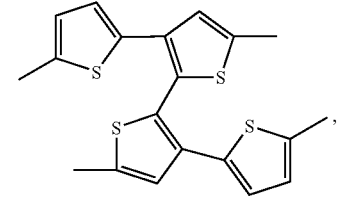
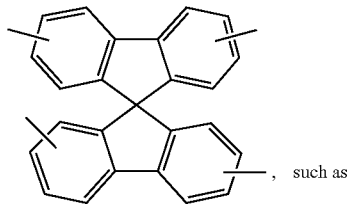
, such as
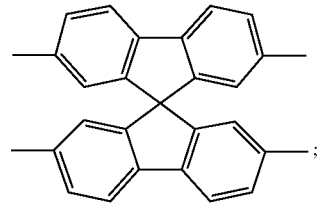
;
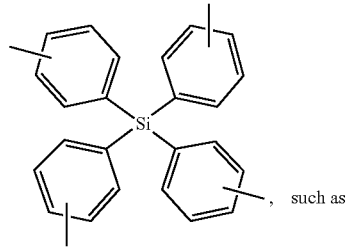
, such as
wherein $R^{200}$, $R^{201}$ and $R^{202}$ are independently of each other H, or $C_1$-$C_{25}$alkyl,

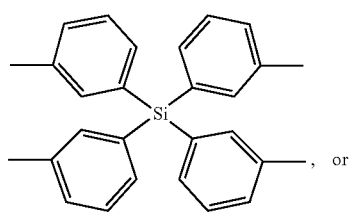, or
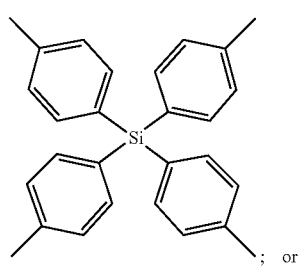; or
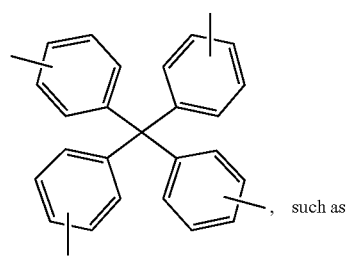, such as
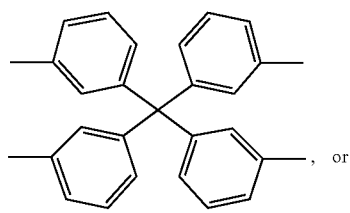, or
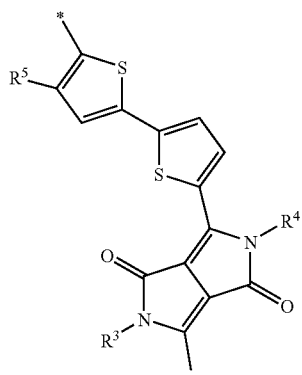
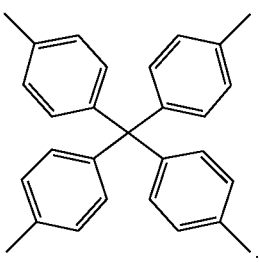.
The use of a multi-functional unit ("Branching Unit") results in branched polymeric materials, as illustrated below (for exemplary purposes only) for two multi-functional units:
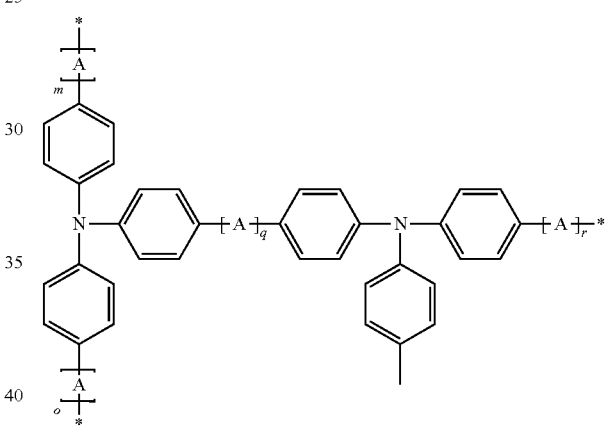
(A is a repeating unit of formula Ia; o, q, r and t are 0 to 500), or
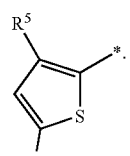

-continued

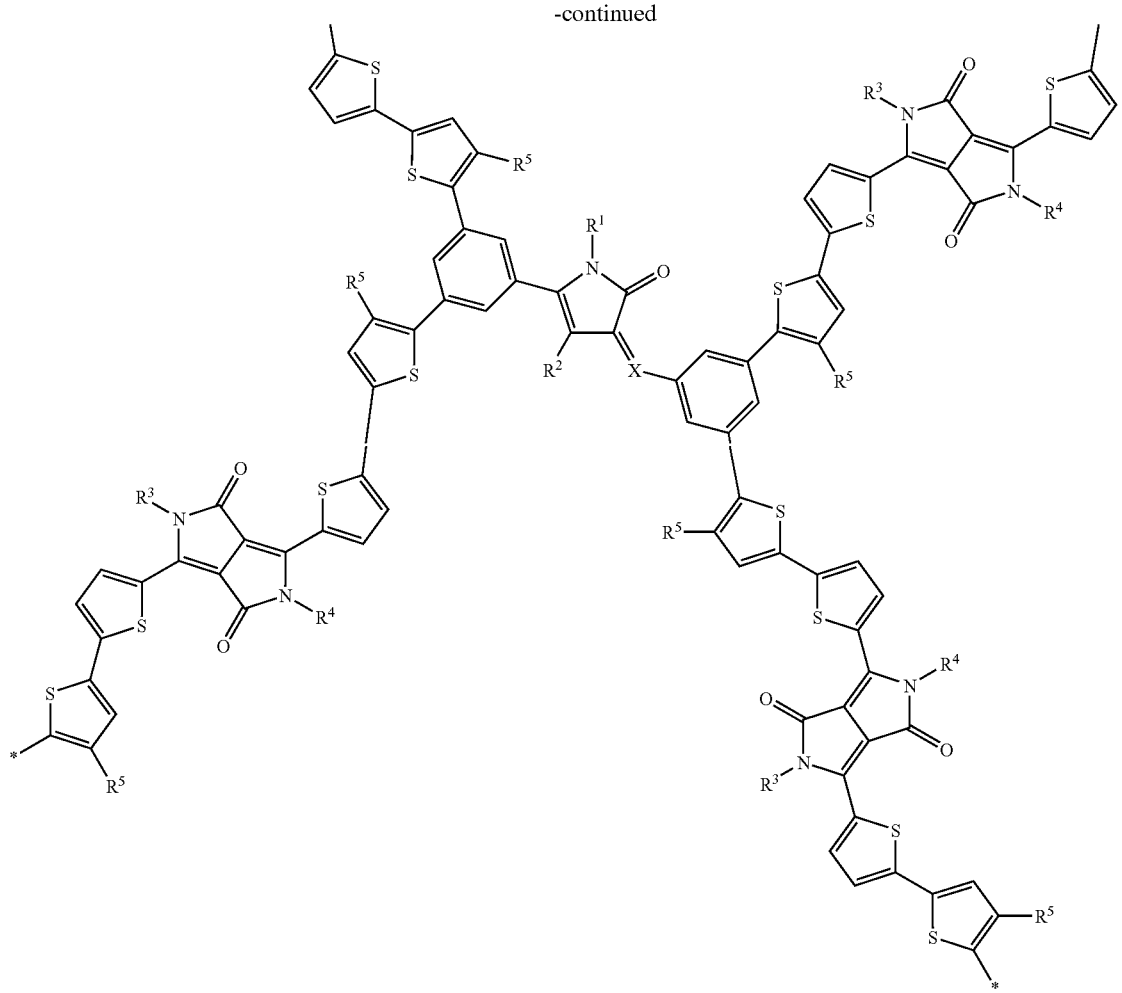

The "Branching Unit" may be of formula

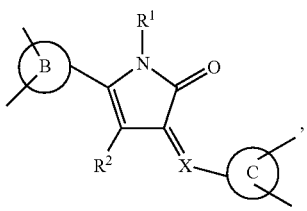

and polymers derived therefrom are new and form further aspects of the present invention.

In one embodiment, the polymers according to the invention consist only of one or more type of repeating units of formula Ia. In a preferred embodiment, the polymers according to the invention consist of precisely one type of repeating unit of formula Ia (homopolymers).

According to the present invention the term "polymer" comprises polymers as well as oligomers, wherein a polymer is a molecule of high relative molecular mass, the structure of which essentially comprises the repetition of units derived, actually or conceptually, from molecules of low relative molecular mass and an oligomer is a molecule of intermediate molecular mass, the structure of which essentially comprises a small plurality of units derived, actually or conceptually, from molecules of lower relative molecular mass. A molecule is regarded as having a high relative molecular mass if it has properties which do not vary significantly with the removal of one or a few of the units. A molecule is regarded as having an intermediate molecular mass if it has properties which do vary significantly with the removal of one or a few of the units.

General coupling reactions such as Heck, Sonogashira, Methathesis or polycondensations, which may be applied in analogy for the preparation of the present compounds (including oligomers and especially polymers), are shown, for example, in the review Babudri et al, J. Mater. Chem., 2004, 14, 11-34.

According to the present invention a homopolymer is a polymer derived from one species of (real, implicit, or hypothetical) monomer. Many polymers are made by the mutual reaction of complementary monomers. These monomers can readily be visualized as reacting to give an "implicit monomer", the homopolymerisation of which would give the actual product, which can be regarded as a homopolymer. Some polymers are obtained by chemical modification of other polymers, such that the structure of the macromolecules that constitute the resulting polymer can be thought of having been formed by the homopolymerisation of a hypothetical monomer.

Accordingly a copolymer is a polymer derived from more than one species of monomer, e.g. bipolymer, terpolymer, quaterpolymer, etc.

The oligomers of this invention have a weight average molecular weight of <3,000 Daltons. The polymers of this invention preferably have a weight average molecular weight of 3,000 Daltons or greater, especially 3,000 to 2,000,000 Daltons, more preferably 10,000 to 1,000,000 and most preferably 10,000 to 750,000 Daltons. Molecular weights are determined according to gel permeation chromatography using polystyrene standards.

In a preferred embodiment the polymers of the present invention are homopolymers, comprising repeating units of the formula Ia, which can be represented by the formula

(VII)

wherein RU is a repeating unit of formula Ia. In said aspect the polymer comprises preferably one of the repeating units of formula IVa to IVi, wherein repeating units of the formula IVa, IVd, IVh and IVi are especially preferred.

Copolymers of formula VII, involving repeating units of formula Ia and COM$^1$ or COM$^2$ (v=0.995 to 0.005, w=0.005 to 0.995), can also be obtained by coupling reactions, such as nickel coupling reactions:

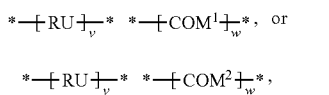
(VIIa)
(VIIb)

wherein RU is as defined above and —COM$^1$- is selected from repeating units of formula:

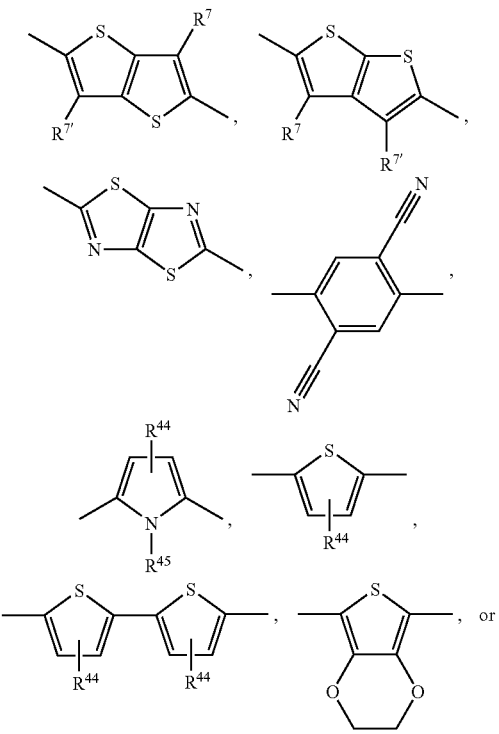

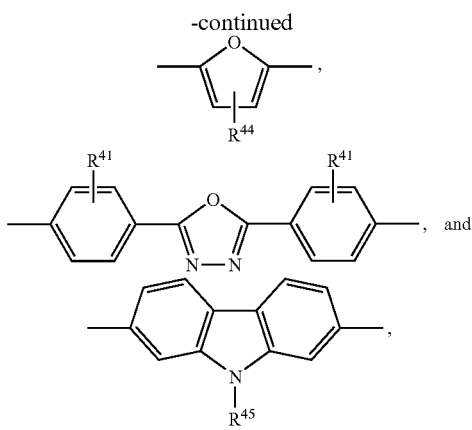

wherein R$^7$ and R$^{7'}$ are as defined above,
R$^{44}$ and R$^{41}$ are hydrogen, C$_1$-C$_{18}$alkyl, or C$_1$-C$_{18}$alkoxy, and
R$^{45}$ is H, C$_1$-C$_{18}$alkyl, or C$_1$-C$_{18}$alkyl which is substituted by E and/or interrupted by D, especially C$_1$-C$_{18}$alkyl which is interrupted by —O—, wherein D and E are as defined above, and —COM$^2$- is a group of formula

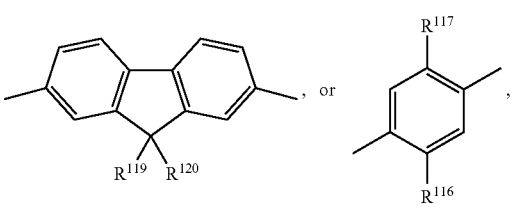

wherein
R$^{116}$ and R$^{117}$ are independently of each other H, C$_1$-C$_{18}$alkyl, which can optionally be interrupted by O, or C$_1$-C$_{18}$alkoxy, which can optionally be interrupted by O,
R$^{119}$ and R$^{120}$ are independently of each other H, C$_1$-C$_{18}$alkyl, which can optionally be interrupted by O, or
R$^{119}$ and R$^{120}$ together form a group of formula =CR$^{100}$R$^{101}$, wherein
R$^{100}$ and R$^{101}$ are independently of each other H, C$_1$-C$_{18}$alkyl, or
R$^{119}$ and R$^{120}$ together form a five or six membered ring, which optionally can be substituted by C$_1$-C$_{18}$alkyl.

In said embodiment the polymer is a polymer of formula

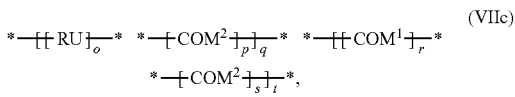
(VIIc)

wherein
RU, COM$^1$ and COM$^2$ are as defined above,
o is 1,
p is 0, or 1,
q is 0.005 to 1,
r is 0, or 1,
s is 0, or 1, wherein e is not 1, if d is 0,
t is 0.995 to 0, wherein the sum of c and f is 1.

Homopolymers of formula VII are, for example, obtained by nickel coupling reactions, especially the Yamamoto reaction:

  (VII)

wherein RU is a repeating unit of formula Ia.

Polymerization processes involving only dihalo-functional reactants may be carried out using nickel coupling reactions. One such coupling reaction was described by Colon et al. in J. Pol. Sci., Part A, Polymer Chemistry Edition 28 (1990) 367, and by Colon et al. in J. Org. Chem. 51 (1986) 2627. The reaction is typically conducted in a polar aprotic solvent (e.g., dimethylacetamide) with a catalytic amount of nickel salt, a substantial amount of triphenylphosphine and a large excess of zinc dust. A variant of this process is described by Ioyda et al. in Bull. Chem. Soc. Jpn, 63 (1990) 80 wherein an organo-soluble iodide was used as an accelerator.

Another nickel-coupling reaction was disclosed by Yamamoto in Progress in Polymer Science 17 (1992) 1153 wherein a mixture of dihaloaromatic compounds were treated with an excess amount of nickel (1,5-cyclooctadiene) complex in an inert solvent. All nickel-coupling reactions when applied to reactant mixtures of two or more aromatic dihalides yield essentially random copolymers. Such polymerization reactions may be terminated by the addition of small amounts of water to the polymerization reaction mixture, which will replace the terminal halogen groups with hydrogen groups. Alternatively, a monofunctional aryl halide may be used as a chain-terminator in such reactions, which will result in the formation of a terminal aryl group.

Nickel-coupling polymerizations yield essentially homopolymers or random copolymers comprising DPP group-containing units and units derived from other co-monomers.

Homopolymers of formula VIId, or VIIe can be obtained, for example, by the Suzuki reaction:

  (VIId)

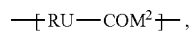  (VIIe)

wherein RU, COM$^1$ and COM$^2$ are as defined above.

The condensation reaction of an aromatic boronate and a halogenide, especially a bromide, commonly referred to as the "Suzuki reaction", is tolerant of the presence of a variety of organic functional groups as reported by N. Miyaura and A. Suzuki in Chemical Reviews, Vol. 95, pp. 457-2483 (1995). Preferred catalysts are 2-dicyclohexylphosphino-2',6'-dialkoxybiphenyl/palladium(II)acetates. An especially preferred catalyst is 2-dicyclohexylphosphino-2',6'-di-methoxybiphenyl (sPhos)/palladium(II)acetate. This reaction can be applied to preparing high molecular weight polymers and copolymers; see e.g. EP-A-1754736.

To prepare polymers corresponding to formula VIId, or VIIe a dihalogenide, such as a dibromide or dichloride, especially a dibromide corresponding to formula

is reacted with an equimolar amount of a diboronic acid or diboronate corresponding to formula

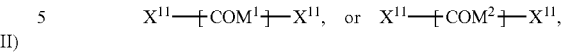

wherein $X^{11}$ is independently in each occurrence —B(OH)$_2$, —B(OY$^1$)$_2$ or

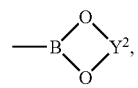

wherein Y$^1$ is independently in each occurrence a C$_1$-C$_{10}$alkyl group and Y$^2$ is independently in each occurrence a C$_2$-C$_{10}$alkylene group, such as —CY$^3$Y$^4$—CY$^5$Y$^6$—, or —CY$^7$Y$^8$—CY$^9$Y$^{10}$—CY$^{11}$Y$^{12}$—, wherein Y$^3$, Y$^4$, Y$^5$, Y$^6$, Y$^7$, Y$^8$, Y$^9$, Y$^{10}$, Y$^{11}$ and Y$^{12}$ are independently of each other hydrogen, or a C$_1$-C$_{10}$alkyl group, especially —C(CH$_3$)$_2$C(CH$_3$)$_2$—, or —C(CH$_3$)$_2$CH$_2$C(CH$_3$)$_2$—, under the catalytic action of Pd and triphenylphosphine. The reaction is typically conducted at about 70° C. to 180° C. in an aromatic hydrocarbon solvent such as toluene. Other solvents such as dimethylformamide and tetrahydrofuran can also be used alone, or in mixtures with an aromatic hydrocarbon. An aqueous base, preferably sodium carbonate or bicarbonate, is used as the HBr scavenger. Depending on the reactivities of the reactants, a polymerization reaction may take 2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252.

If desired, a monofunctional aryl halide or aryl boronate may be used as a chain-terminator in such reactions, which will result in the formation of a terminal aryl group.

It is possible to control the sequencing of the monomeric units in the resulting copolymer by controlling the order and composition of monomer feeds in the Suzuki reaction.

The polymers of the present invention can also be synthesized by the Stille coupling (see, for example, Babudri et al, J. Mater. Chem., 2004, 14, 11-34; J. K. Stille, Angew. Chemie Int. Ed. Engl. 1986, 25, 508). To prepare polymers corresponding to formula VIId, or VIIe a dihalogenide, such as a dibromide or dichloride, especially a dibromide corresponding to formula

is reacted with a compound of formula

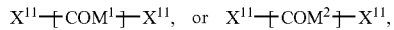

wherein $X^{11}$ is a group —SnR$^{207}$R$^{208}$R$^{209}$, in an inert solvent at a temperature in range from 0° C. to 200° C. in the presence of a palladium-containing catalyst. It must be ensured here that the totality of all monomers used has a highly balanced ratio of organotin functions to halogen functions. In addition, it may prove advantageous to remove any excess reactive groups at the end of the reaction by end-capping with monofunctional reagents. In order to carry out the process, the tin compounds and the halogen compounds are preferably introduced into one or more inert organic solvents and stirred at a temperature of from 0 to 200° C., preferably from 30 to 170° C. for a period of from 1 hour to 200 hours, preferably from 5 hours to 150 hours. The crude product can be purified by methods known to the person skilled in the art and appropriate for the respective polymer, for example repeated re-precipitation or even by dialysis.

Suitable organic solvents for the process described are, for example, ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, benzene, toluene and xylene, alcohols, for example methanol, ethanol, 1-propanol, 2-propanol, ethylene glycol, 1-butanol, 2-butanol and tert-butanol, ketones, for example acetone, ethyl methyl ketone and isobutyl methyl ketone, amides, for example dimethylformamide (DMF), dimethylacetamide and N-methylpyrrolidone, nitriles, for example acetonitrile, propionitrile and butyronitrile, and mixtures thereof.

The palladium and phosphine components should be selected analogously to the description for the Suzuki variant.

Alternatively, the polymers of the present invention can also be synthesized by the Negishi reaction using zinc reagents $(RU—(ZnX^{12})_2$, wherein $X^{12}$ is halogen) and halides or triflates $(COM^1-(X^{11})_2$, wherein $X^{11}$ is halogen or triflate). Reference is, for example, made to E. Negishi et al., Heterocycles 18 (1982) 117-22.

In addition, halogen derivatives of the DPPs can be polymerized oxidatively (for example using $FeCl_3$, see, inter alia, P. Kovacic et al., Chem. Ber. 87 (1987) 357 to 379; M. Wenda et al., Macromolecules 25 (1992) 5125) or electrochemically (see, inter alia, N. Saito et al., Polym. Bull. 30 (1993) 285).

Some of the materials of the present invention are novel compounds. The invention thus includes an oligomer or polymer comprising at least 4 repeating units of the formula

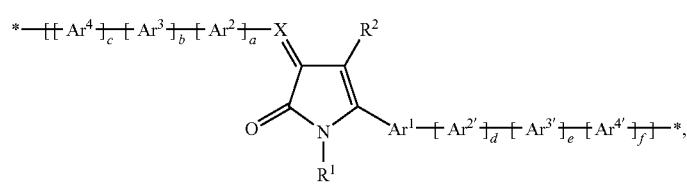

(Ia)

wherein the symbols are as defined above.

A further aspect of the invention relates to both the oxidised and reduced form of the polymers and materials according to this invention. Either loss or gain of electrons results in formation of a highly delocalised ionic form, which is of high conductivity. This can occur on exposure to common dopants. Suitable dopants and methods of doping are known to those skilled in the art, e. g., from EP-0528662, U.S. Pat. No. 5,198,153, or WO96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e. g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e. g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$,$NbCl_5$, $TaCl_5$, $MoF_5$,$MoCl_5$, $WF_5$, $WCl_6$, $UF_6$ and $LnCl_3$ (wherein Ln is a lanthanoid), anions (e. g., $Cl^-$, $Br^-$, $I^-$, $I^{3-}$, $HSO_4^-$, $SO^{2-}$, $NO^{3-}$, $ClO^{4-}$,$BF^{4-}$, $PF^{6-}$, $AsF^{6-}$, $SbF^{6-}$, $FeCl^{4-}$, $Fe(CN)_6^{3-}$, anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $C_2$, $XeOF_4$, $(NO_2^+)(SbF_6^-)$, $(NO_2^+)$ $(SbCl_6^-)$, $(NO_2^+)$ $(BF_4^-)$, $AgClO_4$, $H_2IrCl_6$, $La(NO_3)_3.6$ $H_2O$, $FSC_2OOSO_2F$, Eu, acetylcholine, $R_4N^+$, (R is an alkyl group), $R_4P^+$(R is an alkyl group), $R_6As^+$(R is an alkyl group), and $R_3S^+$(R is an alkyl group).

The conducting form of the compounds and materials of the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

Halogen is fluorine, chlorine, bromine and iodine.

$C_1$-$C_{25}$alkyl is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, iso-heptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_1$-$C_{25}$alkoxy groups are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_2$-$C_{25}$alkenyl groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl; an example being an allyl group optionally substituted one to three times with $C_1$-$C_4$alkyl.

$C_{2-24}$alkynyl is straight-chain or branched and preferably $C_{2-8}$alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

The terms "haloalkyl, haloalkenyl and haloalkynyl" mean groups given by partially or wholly substituting the above-mentioned alkyl group, alkenyl group and alkynyl group with halogen, such as trifluoromethyl etc. The "aldehyde group, ketone group, ester group, carbamoyl group and amino group" include those substituted by an alkyl group, a cycloalkyl group, an aryl group, an aralkyl group or a heterocyclic group, wherein the alkyl group, the cycloalkyl group, the aryl group, the aralkyl group and the heterocyclic group may be unsubstituted or substituted. The term "silyl group" means a group of formula —Si$R^{62}R^{63}R^{64}$, wherein $R^{62}$, $R^{63}$ and $R^{64}$ are independently of each other a $C_1$-$C_8$alkyl group, in particular a $C_1$-$C_4$ alkyl group, a $C_6$-$C_{24}$aryl group or a $C_7$-$C_{12}$aralkylgroup, such as a trimethylsilyl group.

The term "cycloalkyl group" is typically $C_5$-$C_{12}$cycloalkyl, such as cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The term "cycloalkenyl group" means an unsaturated alicyclic hydrocarbon group containing one or more double bonds, such as cyclopentenyl, cyclopentadienyl, cyclohexenyl and the like, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are:

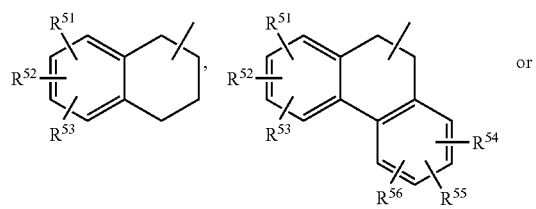

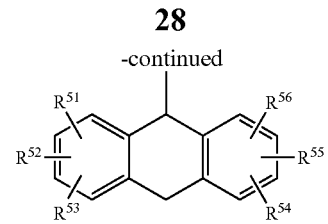

in particular wherein $R^{51}$, $R^{52}$, $R^{53}$, $R^{54}$, $R^{55}$ and $R^{56}$ are independently of each other $C_1$-$C_8$-alkyl, $C_1$-$C_8$-alkoxy, halogen and cyano, in particular hydrogen.

The term "aryl group" is typically $C_6$-$C_{24}$aryl, such as phenyl, indenyl, azulenyl, naphthyl, biphenyl, as-indacenyl, s-indacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of $C_6$-$C_{12}$aryl are phenyl, 1-naphthyl, 2-naphthyl, 3- or 4-biphenyl, 2- or 9-fluorenyl or 9-phenanthryl, which may be unsubstituted or substituted.

The term "aralkyl group" is typically $C_7$-$C_{24}$aralkyl, such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenykoctadecyl, ω-phenyl-eicosyl or ω-phenyl-docosyl, preferably $C_7$-$C_{18}$aralkyl such as benzyl, 2-benzyl-2-propyl, β-phenylethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted.

The term "aryl ether group" is typically a $C_{6-24}$aryloxy group, that is to say O—$C_{6-24}$aryl, such as, for example, phenoxy or 4-methoxyphenyl. The term "aryl thioether group" is typically a $C_{6-24}$arylthio group, that is to say S—$C_{6-24}$aryl, such as, for example, phenylthio or 4-methoxyphenylthio. The term "carbamoyl group" is typically a $C_{1-18}$carbamoyl radical, preferably $C_{1-8}$carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

The terms "aryl" and "alkyl" in alkylamino groups, dialkylamino groups, alkylarylamino groups, arylamino groups and diarylgroups are typically $C_1$-$C_{25}$alkyl and $C_6$-$C_{24}$aryl, respectively.

Alkylaryl refers to alkyl-substituted aryl radicals, especially $C_7$-$C_{12}$alkylaryl. Examples are tolyl, such as 3-methyl-, or 4-methylphenyl, or xylyl, such as 3,4-dimethylphenyl, or 3,5-dimethylphenyl.

Heteroaryl is typically $C_2$-$C_{26}$heteroaryl, i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group or a silyl group.

As described above, the aforementioned groups may be substituted by E and/or, if desired, interrupted by D. Interruptions are of course possible only in the case of groups containing at least 2 carbon atoms connected to one another by single bonds; $C_6$-$C_{18}$aryl is not interrupted; interrupted arylalkyl or alkylaryl contains the unit D in the alkyl moiety. $C_1$-$C_{18}$alkyl substituted by one or more E and/or interrupted by one or more units D is, for example, $(CH_2CH_2O)_{1-9}$—$R^x$, where $R^x$ is H or $C_1$-$C_{10}$alkyl or $C_2$-$C_{10}$alkanoyl (e.g. CO—CH($C_2H_5$)$C_4H_9$), $CH_2$—CH($OR^y$)—$CH_2$—O—$R^y$, where $R^y$ is $C_1$-$C_{18}$alkyl, $C_5$-$C_{12}$cycloalkyl, phenyl, $C_7$-$C_{15}$phenylalkyl, and $R^y$ embraces the same definitions as $R^y$ or is H;
$C_1$-$C_8$alkylene-COO—$R^z$, e.g. $CH_2COOR_z$, $CH(CH_3)$CO-$OR^z$, $C(CH_3)_2COOR^z$, where $R^z$ is H, $C_1$-$C_{18}$alkyl, $(CH_2CH_2O)_{1-9}$—$R^x$, and $R^x$ embraces the definitions indicated above;
$CH_2CH_2$—O—CO—CH=$CH_2$; $CH_2CH(OH)CH_2$—O—CO—C($CH_3$)=$CH_2$.

The polymers of the invention can be used as the semiconductor layer in semiconductor devices. Accordingly, the present invention also relates to semiconductor devices, comprising a polymer of the formula Ia or monomer of formula I. The semiconductor device is especially a diode, an organic field effect transistor and/or a solar cell, or a device containing a diode and/or an organic field effect transistor, and/or a solar cell. There are numerous types of semiconductor devices. Common to all is the presence of one or more semiconductor materials. Semiconductor devices have been described, for example, by S. M. Sze in Physics of Semiconductor Devices, $2^{nd}$ edition, John Wiley and Sons, New York (1981). Such devices include rectifiers, transistors (of which there are many types, including p-n-p, n-p-n, and thin-film transistors), light emitting semiconductor devices (for example, organic light emitting diodes in display applications or backlight in e.g. liquid crystal displays), photoconductors, current limiters, solar cells, thermistors, p-n junctions, field-effect diodes, Schottky diodes, and so forth. In each semiconductor device, the semiconductor material is combined with one or more metals and/or insulators to form the device. Semiconductor devices can be prepared or manufactured by known methods such as, for example, those described by Peter Van Zant in Microchip Fabrication, Fourth Edition, McGraw-Hill, New York (2000). In particular, organic electronic components can be manufactured as described by D. R. Gamota et al. in Printed Organic and Molecular Electronics, Kluver Academic Publ., Boston, 2004.

A particularly useful type of transistor device, the thin-film transistor (TFT), generally includes a gate electrode, a gate dielectric on the gate electrode, a source electrode and a drain electrode adjacent to the gate dielectric, and a semiconductor layer adjacent to the gate dielectric and adjacent to the source and drain electrodes (see, for example, S. M. Sze, Physics of Semiconductor Devices, 2.sup.nd edition, John Wiley and Sons, page 492, New York (1981)). These components can be assembled in a variety of configurations. More specifically, an organic thin-film transistor (OTFT) has an organic semiconductor layer.

Typically, a substrate supports the OTFT during manufacturing, testing, and/or use. Optionally, the substrate can provide an electrical function for the OTFT. Useful substrate materials include organic and inorganic materials. For example, the substrate can comprise silicon materials inclusive of various appropriate forms of silicon, inorganic glasses, ceramic foils, polymeric materials (for example, acrylics, polyester, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly (ethylene terephthalate) (PET), poly(phenylene sulfide) (PPS)), filled polymeric materials (for example, fiber-reinforced plastics (FRP)), and coated metallic foils.

The gate electrode can be any useful conductive material. For example, the gate electrode can comprise doped silicon, or a metal, such as aluminum, chromium, gold, silver, nickel, palladium, platinum, tantalum, and titanium. Conductive oxides, such as indium tin oxide, or conducting inks/pastes comprised of carbon black/graphite or colloidal silver dispersions, optionally containing polymer binders can also be used. Conductive polymers also can be used, for example polyaniline or poly(3,4-ethylenedioxythiophene)/poly(styrene sulfonate) (PEDOT:PSS). In addition, alloys, combinations, and multilayers of these materials can be useful. In some OTFTs, the same material can provide the gate electrode function and also provide the support function of the substrate. For example, doped silicon can function as the gate electrode and support the OTFT.

The gate dielectric is generally provided on the gate electrode. This gate dielectric electrically insulates the gate electrode from the balance of the OTFT device. Useful materials for the gate dielectric can comprise, for example, an inorganic electrically insulating material.

The gate dielectric (insulator) can be a material, such as, an oxide, nitride, or it can be a material selected from the family of ferroelectric insulators (e.g. organic materials such as poly (vinylidene fluoride/trifluoroethylene or poly(m-xylylene adipamide)), or it can be an organic polymeric insulator (e.g. poly(methacrylate)s, poly(acrylate)s, polyimides, benzocyclobutenes (BCBs), parylenes, polyvinylalcohol, polyvinylphenol (PVP), polystyrenes, polyester, polycarbonates) as for example described in J. Veres et al. Chem. Mat. 2004, 16, 4543 or A. Facchetti et al. Adv. Mat. 2005, 17, 1705. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulphide, including but not limited to $PbZr_xTi_{1-x}O_3$ (PZT), $Bi_4Ti_3O_{12}$, $BaMgF_4$, $Ba(Zr_{1-x}Ti_x)O_3$ (BZT). In addition, alloys, hybrid materials (e.g. polysiloxanes or nanoparticle-filled polymers) combinations, and multilayers of these materials can be used for the gate dielectric. The thickness of the dielectric layer is, for example, from about 10 to 1000 nm, with a more specific thickness being about 100 to 500 nm, providing a capacitance in the range of 0.1-100 nanofarads (nF).

The source electrode and drain electrode are separated from the gate electrode by the gate dielectric, while the organic semiconductor layer can be over or under the source electrode and drain electrode. The source and drain electrodes can be any useful conductive material favourably providing a low resistance ohmic contact to the semiconductor layer. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, doped forms thereof, and multilayers thereof. Some of these materials are appropriate for use with n-type semiconductor materials and others are appropriate for use with p-type semiconductor materials, as is known in the art.

The thin film electrodes (that is, the gate electrode, the source electrode, and the drain electrode) can be provided by any useful means such as physical vapor deposition (for example, thermal evaporation or sputtering) or (ink jet) printing methods. The patterning of these electrodes can be accomplished by known methods such as shadow masking, additive photolithography, subtractive photolithography, printing, microcontact printing, and pattern coating.

The present invention further provides a thin film transistor device comprising a plurality of electrically conducting gate electrodes disposed on a substrate;
a gate insulator layer disposed on said electrically conducting gate electrodes;
a plurality of sets of electrically conductive source and drain electrodes disposed on said insulator layer such that each of said sets is in alignment with each of said gate electrodes;
an organic semiconductor layer disposed in the channel between source and drain electrodes on said insulator layer substantially overlapping said gate electrodes; wherein said organic semiconductor layer is a polymer of the formula Ia or monomer of formula I.

The present invention further provides a process for preparing a thin film transistor device (bottom-gate configuration) comprising the steps of:
depositing a plurality of electrically conducting gate electrodes on a substrate;
depositing a gate insulator layer on said electrically conducting gate electrodes;
depositing a plurality of sets of electrically conductive source and drain electrodes on said layer such that each of said sets is in alignment with each of said gate electrodes;
depositing a layer of a compound of the formula I or Ia on said insulator layer such that said layer of the compound of formula I or Ia substantially overlaps said gate electrodes; thereby producing the thin film transistor device.

TFT devices comprising the top-gate configuration are prepared in analogy to these procedures and known methods for this device architecture.

Any suitable substrate can be used to prepare the thin films of the compounds of the present invention. Preferably, the substrate used to prepare the above thin films is a metal, silicon, plastic, paper, coated paper, fabric, glass or coated glass.

Alternatively, a TFT is fabricated by, for example, by solution deposition of a compound on a highly doped silicon substrate covered with a thermally grown oxide layer followed by vacuum deposition and patterning of source and drain electrodes.

In yet another approach, a TFT is fabricated by deposition of source and drain electrodes on a highly doped silicon substrate covered with a thermally grown oxide and then solution deposition of the compound to form a thin film.

The gate electrode may also be a patterned metal gate electrode on a substrate or a conducting material, such as a conducting polymer, which is then coated with an insulator applied either by solution coating or by vacuum deposition on the patterned gate electrodes.

Any suitable solvent can be used to dissolve, and/or disperse the compounds of the present application, provided it is inert, can dissolve at least some of material and can be removed from the substrate by conventional drying means (e.g. application of heat, reduced pressure, airflow etc.). Suitable organic solvents for processing the semiconductors of the invention include, but are not limited to, aromatic or aliphatic hydrocarbons, halogenated such as chlorinated or fluorinated hydrocarbons, esters, ethers amides, such as chloroform, tetrachloroethane, tetrahydrofuran, toluene, tetraline, anisole, xylene, ethyl acetate, methyl ethyl ketone, dimethyl formamide, dichlorobenzene, trichlorobenzene, propylene glycol monomethyl ether acetate (PGMEA) and mixtures thereof. The solution, and/or dispersion is then applied by a method, such as, spin-coating, dip-coating, screen printing, microcontact printing, doctor blading or other solution application techniques known in the art on the substrate to obtain thin films of the semiconducting material.

The term "dispersion" covers any composition comprising the semiconductor material of the present invention, which is not fully dissolved in a solvent. The dispersion may be prepared selecting a composition including at least a compound of formula I or Ia and a solvent, wherein the polymer exhibits lower solubility in the solvent at room temperature but exhibits greater solubility in the solvent at an elevated temperature, wherein the composition gels when the elevated temperature is lowered to a first lower temperature without agitation;
dissolving at the elevated temperature at least a portion of the polymer in the solvent; lowering the temperature of the composition from the elevated temperature to the first lower temperature; agitating the composition to disrupt any gelling, wherein the agitating commences at any time prior to, simultaneous with, or subsequent to the lowering the elevated temperature of the composition to the first lower temperature; depositing a layer of the composition wherein the composition is at a second lower temperature lower than the elevated temperature; and drying at least partially the layer.

The dispersion can also be constituted of (a) a continuous phase comprising a solvent, a binder resin, and optionally a dispersing agent, and (b) a disperse phase comprising an organic semiconductor material of the present invention. The degree of solubility of the semiconductor material in the solvent may vary for example from 0% to about 20% solubility, particularly from 0% to about 5% solubility.

Preferably, the thickness of the organic semiconductor layer is in the range of from about 5 to about 1000 nm, especially the thickness is in the range of from about 10 to about 100 nm.

The materials of the present invention may also be used for the preparation of a vertical organic FET (VOFET) device architecture, such as described in WO07/04804, WO05/24907, US-2006-208251. VOFETs, often providing higher current, are particularly useful for OLED-backplanes.

The polymers of the invention can be used alone or in combination as the organic semiconductor layer of the semiconductor device. The layer can be provided by any useful means, such as, for example, vapor deposition (for materials with relatively low molecular weight) and printing techniques. The compounds of the invention may be sufficiently soluble in organic solvents and can be solution deposited and patterned (for example, by spin coating, dip coating, ink jet printing, gravure printing, flexo printing, offset printing, screen printing, microcontact (wave)-printing, drop or zone casting, or other known techniques).

The compounds of the invention may be used in integrated circuits comprising a plurality of OTFTs, as well as in various electronic articles. Such articles include, for example, radio-frequency identification (RFID) tags, backplanes for flexible displays (for use in, for example, personal computers, cell phones, or handheld devices), smart cards, memory devices, sensors (e.g. light-, image-, bio-, chemo-, mechanical- or temperature sensors) or security devices and the like.

The invention further provides organic photovoltaic (PV) devices (solar cells) comprising a compound according to the present invention.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the compounds/polymers of the present invention. Preferably, the photoactive layer is made of a conjugated compound/polymer of the present invention, as an electron donor and a fullerene, particularly a functionalized fullerene PCBM, as an electron acceptor.

The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{60}$ to $C_{96}$. Most preferably the fullerene is $C_{60}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of another polymer of formula I or any semi-conducting polymer provided that the polymers retain acceptor-type and electron mobility characteristics, organic small molecules, carbon nanotubes, inorganic particles (quantum dots, quantum rods, quantum tripods, $TiO_2$, ZnO etc.).

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). Another suitable metal substitute is the transparent conductive polymer polyanaline (PANI) and its chemical relatives, or PEDOT:PSS. Metal substitutes may be further selected from a wide range of non-metallic materials, wherein the term "non-metallic" is meant to embrace a wide range of materials provided that the material is free of metal in its chemically uncombined form. Highly transparent, non-metallic, low resistance cathodes or highly efficient, low resistance metallic/non-metallic compound cathodes are, for example, disclosed in U.S. Pat. No. 6,420,031 and U.S. Pat. No. 5,703,436.

The substrate can be, for example, a plastic (flexible substrate), or glass substrate.

In another preferred embodiment of the invention, a smoothing layer is situated between the anode and the photoactive layer. A preferred material for this smoothing layer comprises a film of 3,4-polyethylenedioxythiophene (PEDOT), or 3,4-polyethylenedioxythiophene:polystyrene-sulfonate (PEDOT:PSS).

In a preferred embodiment of the present invention, the photovoltaic cell comprises, as described for example in U.S. Pat. No. 6,933,436, a transparent glass carrier, onto which an electrode layer made of indium/tin oxide (ITO) is applied. This electrode layer generally has a comparatively rough surface structure, so that it is covered with a smoothing layer made of a polymer, typically PEDOT, which is made electrically conductive through doping. The photoactive layer is made of two components, has a layer thickness of, for example, 100 nm to a few μm depending on the application method, and is applied onto this smoothing layer. Photoactive layer is made of a conjugated polymer of the present invention, as an electron donor and a fullerene, particularly functionalized fullerene PCBM, as an electron acceptor. These two components are mixed with a solvent and applied as a solution onto the smoothing layer by, for example, the spin-coating method, the casting method, the Langmuir-Blodgett ("LB") method, the ink jet printing method and the dripping method. A squeegee or printing method could also be used to coat larger surfaces with such a photoactive layer. Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and mixtures thereof.

Before a counter electrode is applied, a thin transition layer, which must be electrically insulating, having a layer thickness of, for example, 0.6 nm, is applied to photoactive layer 4. In this exemplary embodiment, this transition layer is made of an alkali halogenide, namely a lithium fluoride, which is vapor deposited in a vacuum of $2 \cdot 10^{-6}$ torr at a rate of 0.2 nm/minute.

If ITO is used as a hole-collecting electrode, aluminum, which is vapor deposited onto the electrically insulating transition layer, is used as an electron-collecting electrode. The electric insulation properties of the transition layer obviously prevent influences which hinder the crossing of the charge carrier from being effective, particularly in the transition region from the photoactive layer to the transition layer.

In a further embodiment on the invention, one or more of the layers may be treated with plasma prior to depositing the next layer. It is particularly advantageous that the PEDOT: PSS layer be subject to a mild plasma treatment prior to deposition of the next layer.

The photovoltaic (PV) device can also consist of a multilayer heterojunction device. Such structures are, for example, described in Adv. Mater. 18, 2872-2875 (2006) where the device comprise in this order:
(a) a cathode (electrode),
(b) optionally a transition layer, such as an alkali halogenide, especially lithium fluoride,
(c) optionally an exciton blocking layer (such as bathocuproine (BCP), 3,4,9,10-perylenetetra carboxylic bis-benzimidazole (PTCBI), . . . )
(d) a photoactive acceptor layer,
(e) optionally a photoactive donor/acceptor mixed layer,
(f) a photoactive donor layer,
(g) optionally a hole transport layer (such as N,N'-diphenyl-N,N'-bis(3-methylphenyl)[1,1'-biphenyl]-4,4'-diamine (MeOTPD), N,N'-diphenyl-N,N'-bis(4'-(N,N-bis(naphth-1-yl)-amino)-biphenyl-4-yl)benzidine, (Di-NPB), . . . )
(h) optionally a smoothing layer,
(i) an anode (electrode).

At least one of the photoactive layers comprises the compounds/polymers of the present invention. Preferably, the photoactive donor layer is made of a conjugated compound/polymer of the present invention, and the photoactive acceptor layer is made of a fullerene, particularly $C_{60}$ or PCBM.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006) WO2004/112161 and Adv. Funct. Mater. 18, 169-181 (2008).

A so called 'tandem solar cell' comprise in this order:
(a) a cathode (electrode),
(b) optionally a transition layer, such as an alkali halogenide, especially lithium fluoride,
(c) a photoactive layer,
(d) optionally a smoothing layer,
(e) a middle electrode (such as Au, Al, ZnO, $TiO_2$ etc.)
(f) optionally an extra electrode to match the energy level,
(g) optionally a transition layer, such as an alkali halogenide, especially lithium fluoride,
(h) a photoactive layer,
(i) optionally a smoothing layer,
(j) an anode (electrode),
(k) a substrate.

The multiple junction solar cells device can also consist of a multilayer heterojunction device, where the device comprises in this order:
(a) a cathode (electrode),
(b) optionally a transition layer, such as an alkali halogenide, especially lithium fluoride,
(c) optionally an exciton blocking layer (such as bathocuproine (BCP), 3,4,9,10-perylenetetra carboxylic bis-benzimidazole (PTCBI), . . . )
(d) a photoactive acceptor layer,
(e) optionally a photoactive donor/acceptor mixed layer,
(f) a photoactive donor layer,
(g) optionally a hole transport layer (such as N,N'-diphenyl-N,N'-bis(3-methylphenyl)[1,1'-biphenyl]-4,4'-diamine (MeOTPD), N,N'-diphenyl-N,N'-bis(4'-(N,N-bis(naphth-1-yl)-amino)-biphenyl-4-yl)benzidine, (Di-NPB), . . . )
(h) optionally a smoothing layer,
(i) a middle electrode (such as Au, Al, ZnO, $TiO_2$ etc.)
(j) optionally an extra electrode to match the energy level,
(k) optionally a transition layer, such as an alkali halogenide, especially lithium fluoride,
(l) optionally an exciton blocking layer (such as bathocuproine (BCP), 3,4,9,10-perylenetetra carboxylic bis-benzimidazole (PTCBI), . . . )
(m) a photoactive acceptor layer,
(n) optionally a photoactive donor/acceptor mixed layer,
(o) a photoactive donor layer,
(p) optionally a hole transport layer (such as N,N'-diphenyl-N,N'-bis(3-methylphenyl)[1,1'-biphenyl]-4,4'-diamine (MeOTPD), N,N'-diphenyl-N,N'-bis(4'-(N,N-bis(naphth-1-yl)-amino)-biphenyl-4-yl)benzidine, (Di-NPB), . . . )
(q) optionally a smoothing layer,
(r) an anode (electrode).

The PV device can also be processed on a fiber as described, for example, in US20070079867 and US 20060013549.

Due to their excellent self-organising properties the inventive compounds, materials or films can also be used alone or together with other materials in or as alignment layers in LCD or OLED devices, as described for example in US2003/0021913.

The following examples are included for illustrative purposes only and do not limit the scope of the claims. Unless otherwise stated, all parts and percentages are by weight. Weight-average molecular weight ($M_w$) and polydispersity ($M_w/M_n$=PD) are determined by Gel Permeation Chromatography (GPC) [Apparatus: $GPC_{max}$+TDA 302 from Viscotek (Houston, Tex., USA) yielding the responses form refractive index (RI), low angle light scattering (LALS), right angle light scattering (RALS) and differential viscosity (DP) measurements. Chromatographic conditions: Column: $PL_{gel}$ mixed C (300×7.5 mm, 5 μm particles) covering the molecular weight range from about $1 \times 10^3$ to about $2.5 \times 10^6$ Da from Polymer Laboratories (Church Stretton, UK); Mobile phase: tetrahydrofuran containing 5 g/l of sodium trifluoroacetate; Mobile phase flow: either 0.5 or 0.7 ml/min; Solute concentration: about 1-2 mg/ml; Injection volume: 100 μl; Detection: RI, LALS, RALS, DP. *Procedure of molecular weight calibration*: Relative calibration is done by use of a set of 10 polystyrene calibration standards obtained from Polymer Laboratories (Church Stretton, UK) spanning the molecular weight range from 1,930,000 Da-5,050 Da, i. e., PS 1,930, 000, PS 1,460,000, PS 1,075,000, PS 560,000, PS 330,000, PS 96,000, PS 52,000, PS 30,300, PS 10,100, PS 5,050 Da. Absolute calibration is done on the base of the responses of LALS, RALS and DP. As experienced in a large number of investigations this combination provides optimum calculation of molecular weight data. Usually PS 96,000 is used as the molecular weight calibration standard, but in general every other PS standard lying in the molecular weight range to be determined can be chosen for this purpose.

All polymer structures given in the examples below are idealized representations of the polymer products obtained via the polymerization procedures described. If more than two components are copolymerized with each other sequences in the polymers can be either alternating or random depending on the polymerisation conditions. Unless otherwise indicated, all percentages are by weight, "over night" stands for a time period of 14 to 16 hours, and room temperature denotes a temperature from the range 20-25° C. Abbreviations in examples, specification and/or claims:

CSEM Centre Suisse d'Electronique et de Microtechnique SA
ITO indium doped tin oxide
Ph phenyl
t- denotes a tertiary (alkyl) group, such as t-Bu standing for tertiary butyl
Bu butyl
LC liquid chromatography
MS mass spectrometry
CIE International Commission on Illumination/chromaticity
NMR nuclear magnetic resonance, of $^1$H if not otherwise indicated
DMF dimethyl formamide
DMSO dimethyl sulfoxide
OFET organic field effect transistor

PREPARATION EXAMPLES a) 5,5'-bromobiindolyliden-2,2'-dione 1 and 6,6'-bromobiindolyliden-2,2'-dione 2 are synthesized according to the literature in one high-yielding step from 5-bromooxindole and 5-bromoisatin, or 6-bromooxindole and 6-bromoisatin (Papageorgiou, C.; Borer, X. Helv. Chim. Acta 1988, 71, 1079).

b)

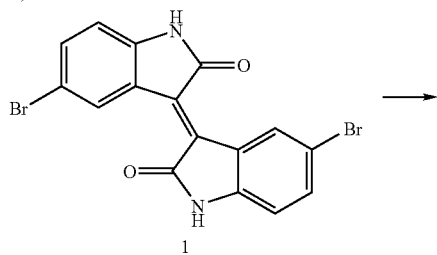

1 c)

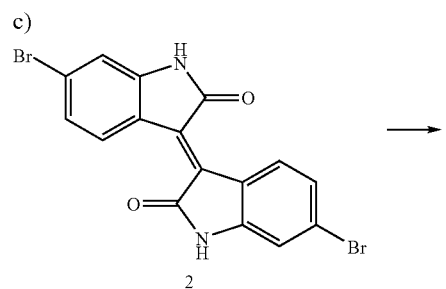

2

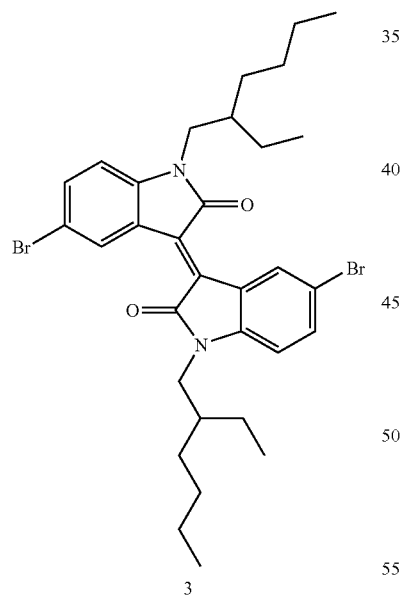

3

3 g (7.1 mmol, 1 eq) of 1, 3.4 g (17.9 mmol, 2.5 eq) of 1-bromo-2-ethylhexane and 6 g (43 mmol, 6 eq) of K$_2$CO$_3$ are stirred in DMF (100 mL) under nitrogen overnight at 100° C. Then the mixture is poured in water and the solid filtrated and washed several times with water and ethanol. The solid is dissolved in a minimum of chloroform and precipitated in ethanol to yield 3.05 g of pure 3 as a red-violet powder. Yield 67%; RMN $^1$H (CDCl$_3$, δ ppm): 0.89 (m, 12H), 1.2-1.5 (m, 16H), 1.82 (m, 2H), 3.68 (m, 4H), 6.63 (d, 2H), 7.47 (dd, 2H), 9.37 (d, 2H).

4

7 g (16.6 mmol, 1 eq) of 2, 8 g (41.7mmol, 2.5 eq) of 1-bromo-2-ethylhexane and 13.9 g (100 mmol, 6 eq) of K$_2$CO$_3$ are stirred in DMF (200mL) under nitrogen overnight at 100° C. Then the mixture is poured in water and the solid filtrated and washed several times with water and ethanol. The solid is dissolved in a minimum of chloroform and precipitated in ethanol to yield 8.45 g of pure 4 as a red-violet powder.

Yield 79%;

RMN 1H (CDCl3, δ ppm): 0.89 (m, 12H), 1.2-1.5 (m, 16H), 1.90 (m, 2H), 3.610 (m, 4H), 6.91 (d, 2H, J=1.76 Hz), 7.16 (dd, 2H, J=8.50, 1.76 Hz), 9.07 (d, 2H, J=8.50 Hz).

d)

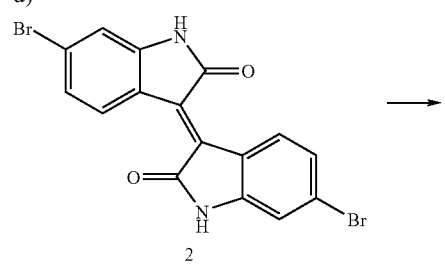

2

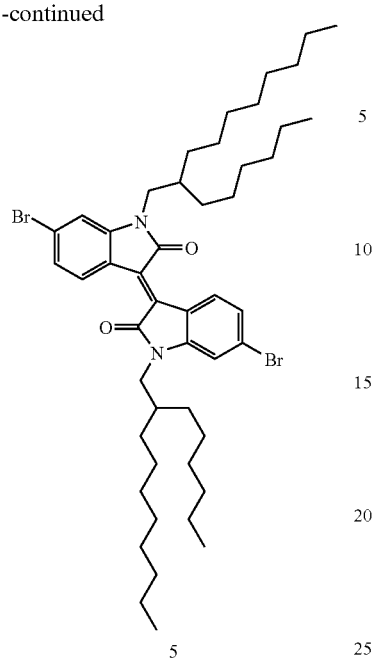

5

8 g (19 mmol, 1 eq) of 2, 12.8 g (42 mmol, 2.25 eq) of 1-bromo-2-hexyldecane and 16 g (115 mmol, 6 eq) of $K_2CO_3$ are stirred in DMF (150mL) under nitrogen overnight at 100° C. Then the mixture is poured in water and the oil decanted and washed several times with water and ethanol. The oil is dissolved in a minimum of chloroform and poured in ethanol to yield 12.1 g of pure 5 as a red-violet oil which slowly solidify.

Yield 73%;

RMN 1H (CDCl3, δ ppm): 0.89 (m, 12H), 1.2-1.5 (m, 48H), 1.90 (m, 2H), 3.610 (m, 4H), 6.91 (d, 2H, J=1.76 Hz), 7.16 (dd, 2H, J=1.76 Hz), 9.07 (d, 2H, J=1.76 Hz).

e)

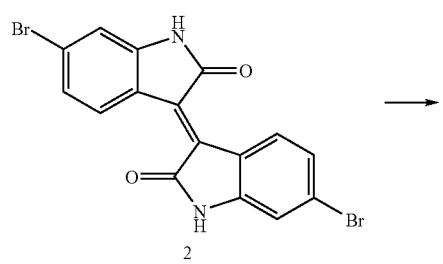

2

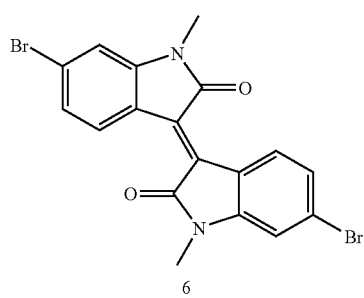

6

10 g (24 mmol, 1 eq) of 2, 8.5 g (60 mmol, 2.5 eq) of iodomethane and 20 g (145 mmol, 6 eq) of $K_2CO_3$ are stirred in DMF (150mL) under nitrogen overnight at 100° C. Then the mixture is poured in water and the solid filtrated and washed several times with water and ethanol and directly used as it is for the next step.

Yield 94%;

f)

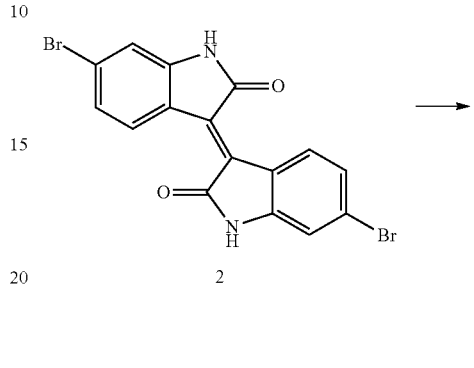

2

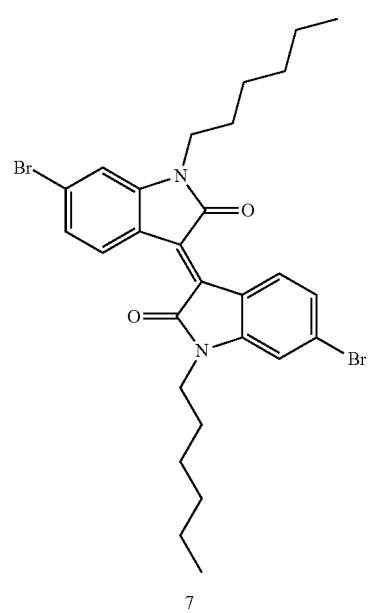

7

8 g (19 mmol, 1 eq) of 2, 7.8 g (47.6mmol, 2.5 eq) of 1-bromohexane and 15.8 g (110 mmol, 6 eq) of $K_2OC_3$ are stirred in DMF (100mL) under nitrogen overnight at 100° C. Then the mixture is poured in water and the solid filtrated and washed several times with water and ethanol. The solid is dissolved in a minimum of chloroform and precipitated in ethanol to yield 10.30 g of pure 7 as a red powder.

Yield 92%;

RMN 1H (CDCl3, δ ppm): 0.89 (m, 6H), 1.2-1.5 (m, 12H), 1.63 (m, 4H), 3.70 (m, 4H), 6.93 (d, 2H, J=1.84 Hz), 7.18 (dd, 2H, J=8.50, 1.84 Hz), 9.20 (d, 2H, J=8.50 Hz).

Oligomers g)

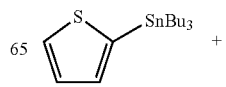
+

-continued

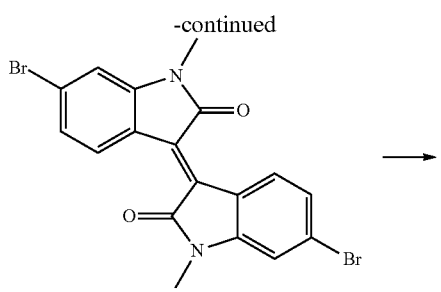

6

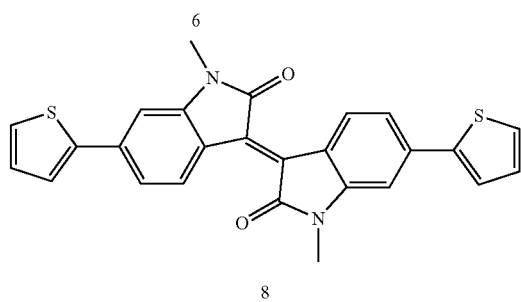

8

Under nitrogen, with 50 mL of toluene, 1 g (2.23 mmol, 1 eq) of 6, 2 g of 2-tributylstannylthiophene (5.6 mmol, 2.5 eq) and 260 mg of Pd(Ph$_3$)$_4$ (225 μmol, 0.1 eq) are stirred overnight at 120° C. Then, the solvent is removed under vacuum and the resulting dark solid is purified over silica gel (gradient Heptane/CH$_2$Cl$_2$) to yield 770 mg of pure 8 as a black solid.

Yield 73%;

RMN 1H (CDCl3, δ ppm): 3.28 (s, 6H), 6.93 (d, 2H, J=1.76 Hz), 7.06 (dd, 2H, J=5.28, 3.81 Hz), 7.27 (dd, 2H, J=8.50, 1.76 Hz), 7.29 (dd, 2H, J=5.28, 0.52 Hz), 7.38 (dd, 2H, J=3.81, 0.52 Hz), 9.14 (d, 2H, J=8.50 Hz).
h)

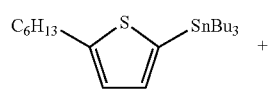

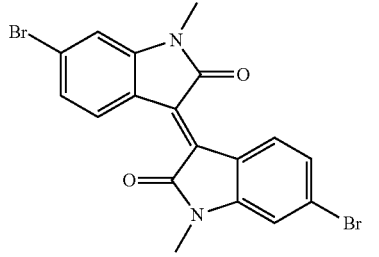

9

Under nitrogen, with 50 mL of toluene, 1.1 g (2.4 mmol, 1 eq) of 6, 2.7 g of 2-tributylstannyl-5-hexylthiophene (6 mmol, 2.5 eq) and 280 mg of Pd(Ph$_3$)$_4$ (240 μmol, 0.1 eq) are stirred overnight at 120° C. Then, the solvent is removed under vacuum and the resulting dark solid is purified over silica gel (gradient Heptane/CH$_2$Cl$_2$) to yield 1.1 g of pure 9 as a black solid.

Yield 74%;

RMN 1H (CDCl3, δ ppm): 0.89 (t, 6H), 1.2-1.4 (m, 12H), 1.65 (m, 4H), 2.77 (t, 4H), 3.28 (s, 6H), 6.72 (d, 2H, J=3.66 Hz), 6.93 (d, 2H, J=1.83 Hz), 7.17-7.22 (m, 4H), 9.10 (d, 2H, J=8.42 Hz).
i)

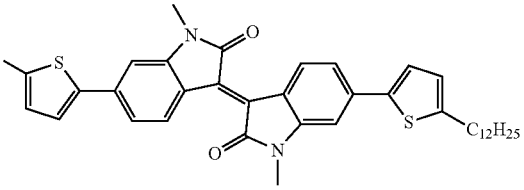

10

Under nitrogen, with 50 mL of toluene, 2.3 g (5.2 mmol, 1 eq) of 6, 6.8 g of 2-tributylstannyl-5-dodecylthiophene (13 mmol, 2.5 eq) and 600 mg of Pd(Ph$_3$)$_4$ (520 μmol, 0.1 eq) are stirred overnight at 120° C. Then, the solvent is removed under vacuum and the resulting dark solid is purified over silica gel (gradient Heptane/CH$_2$Cl$_2$) to yield 3.0 g of pure 10 as a black solid.

Yield 73%;

RMN 1H (CDCl3, δ ppm): 0.89 (t, 6H), 1.2-1.4 (m, 36H), 1.65 (m, 4H), 2.76 (t, 4H), 3.24 (s, 6H), 6.72 (d, 2H, J=3.52 Hz), 6.93 (d, 2H, J=1.87 Hz), 7.17-7.22 (m, 4H), 9.10 (d, 2H, J=8.50 Hz).
k)

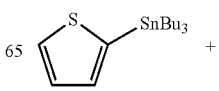

-continued

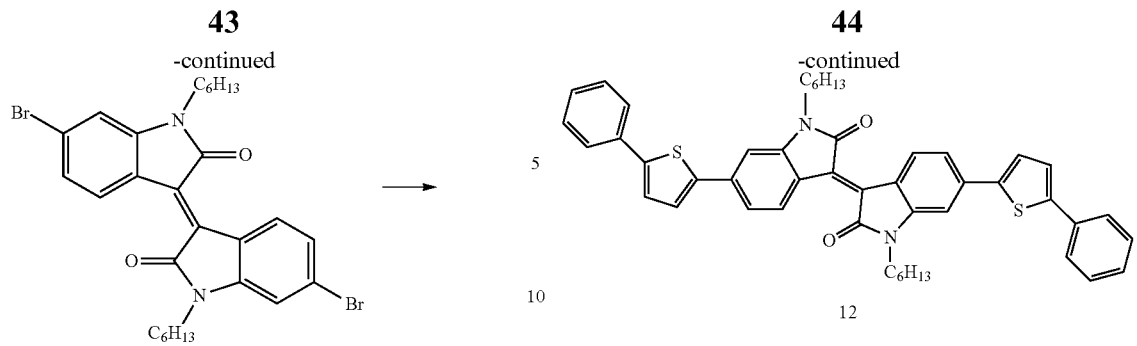

Under nitrogen, with 100 mL of toluene, 2.95 g (5 mmol, 1 eq) of 7, 5.6 g of tributyl-(5-phenyl-thiophen-2-yl)-stannane (12 mmol, 2.5 eq) and 580 mg of Pd(Ph$_3$)$_4$ (580 μmol, 0.1 eq) are stirred overnight at 120° C. Then, the solvent is removed under vacuum and the resulting dark solid is purified over silica gel (gradient Heptane/CH$_2$Cl$_2$) to yield 2.6 g of pure 12 as a black solid.

Yield 69%;

RMN 1H (CDCl3, δ ppm): 0.89 (t, 6H), 1.2-1.4 (m, 12H), 1.69 (m, 4H), 3.77 (t, 4H), 6.92 (d, 2H, J=1.76 Hz), 7.06 (dd, 2H, J=5.49, 3.66 Hz), 7.20-7.27 (m, 6H), 7.30-7.37 (m, 6H), 7.60 (m, 4H), 9.11 (d, 2H, J=8.20 Hz).)

m)

Under nitrogen, with 70 mL of toluene, 2.95 g (5 mmol, 1 eq) of 7, 4.6 g of 2-tributylstannylthiophene (12 mmol, 2.5 eq) and 580 mg of Pd(Ph$_3$)$_4$ (500 μmol, 0.1 eq) are stirred overnight at 120° C. Then, the solvent is removed under vacuum and the resulting dark solid is purified over silica gel (gradient Heptane/CH$_2$Cl$_2$) to yield 2.3 g of pure 11 as a black solid.

Yield 77%;

RMN 1H (CDCl3, δ ppm): 0.89 (t, 6H), 1.2-1.4 (m, 12H), 1.69 (m, 4H), 3.76 (t, 4H), 6.93 (d, 2H, J=1.83 Hz), 7.06 (dd, 2H, J=5.49, 3.66 Hz), 7.24 (dd, 2H, J=8.42, 1.83 Hz), 7.29 (dd, 2H, J=5.49, 0.56 Hz), 7.37 (dd, 2H, J=3.66, 0.56 Hz), 9.14 (d, 2H, J=8.42 Hz).

l)

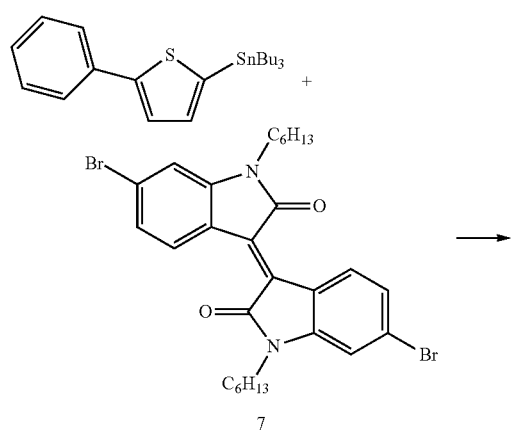

Under nitrogen, with 100 mL of toluene, 2.95 g (5 mmol, 1 eq) of 7, 5.7 g of [2,2']Bithiophenyl-5-yl-tributyl-stannane (12 mmol, 2.5 eq) and 580 mg of Pd(Ph$_3$)$_4$ (580 μmol, 0.1 eq) are stirred overnight at 120° C. Then, the solvent is removed under vacuum and the resulting dark solid is purified over silica gel (gradient Heptane/CH$_2$Cl$_2$) to yield 2.3 g of pure 13 as a black solid.

Yield 62%;

RMN 1H (CDCl3, δ ppm): 0.89 (t, 6H), 1.2-1.4 (m, 12H), 1.69 (m, 4H), 3.76 (t, 4H), 6.88 (d, 2H, J=1.84 Hz), 6.98 (dd, 2H, J=4.98, 3.81 Hz), 7.11 (d, 2H, J=3.81 Hz), 7.16-7.26 (m, 6H), 7.28 (d, 2H, J=3.81 Hz), 9.11 (d, 2H, J=8.50 Hz).

n)

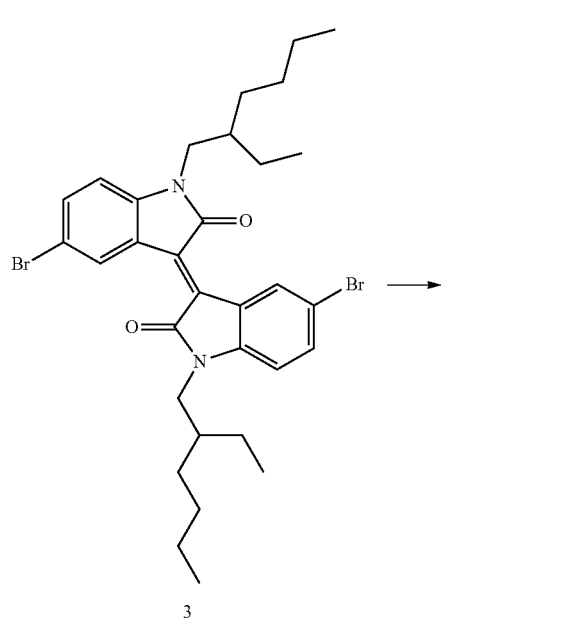

3

14 o)

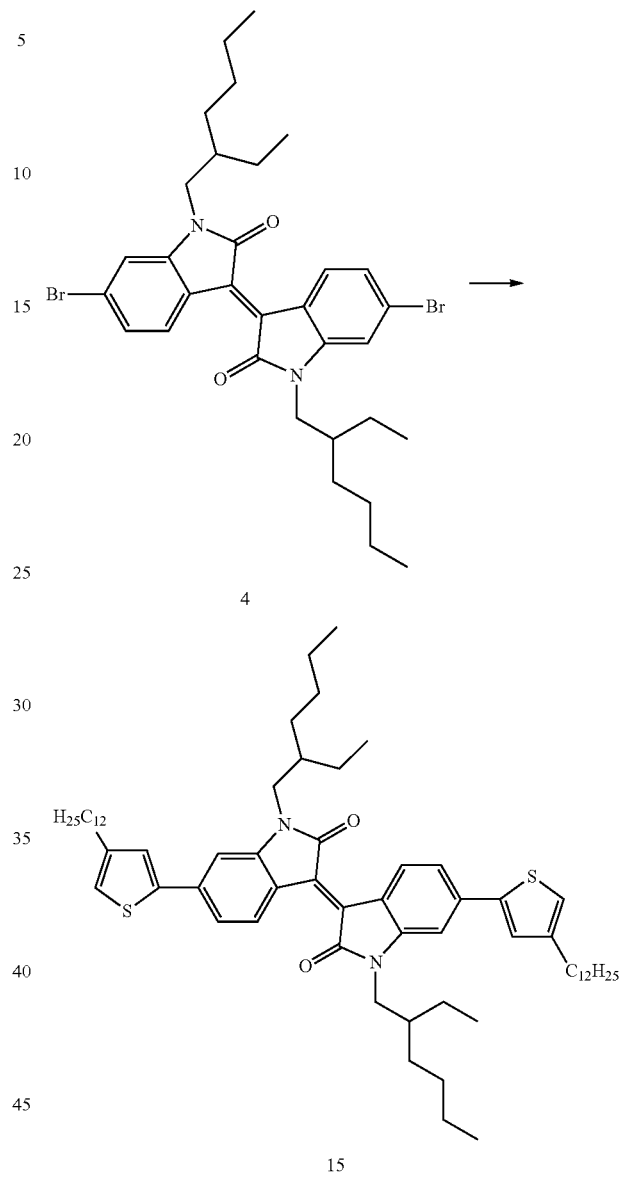

4

15

Under nitrogen, with 60 mL of toluene, 3 g (4.65 mmol, 1 eq) of 3, 6.3 g of 2-tributylstannyl-4-dodecylthiophene (11.6 mmol, 2.5 eq) and 270 mg of Pd(Ph$_3$)$_4$ (230 μmol, 0.05 eq) are stirred overnight at 120° C. Then, the solvent is removed under vacuum and the resulting dark oil is purified over silica gel (gradient Heptane/CH$_2$Cl$_2$) to yield 2.9 g of pure 14 as a black solid.

Yield 63%;

RMN $^1$H (CDCl$_3$, δ ppm): 0.89 (m, 18H), 1.2-1.6 (m, 52H), 1.63 (m, 4H), 1.90 (m, 2H), 2.64 (t, 4H), 3.73 (m, 4H), 6.72 (d, 2H, J=8.20 Hz), 6.72 (d, 2H, J=1.46 Hz), 7.07 (d, 2H, J=1.46 Hz), 7.48 (dd, 2H, J=1.76 Hz), 9.44 (d, 2H, J=1.76 Hz).

Under nitrogen, with 200 mL of toluene, 7 g (11 mmol, 1 eq) of 4, 14.7 g of 2-tributylstannyl-4-dodecylthiophene (27 mmol, 2.5 eq) and 1.2 g of Pd(Ph$_3$)$_4$ (1 mmol, 0.1 eq) are stirred overnight at 120° C. Then, the solvent is removed under vacuum and the resulting dark oil is purified over silica gel (gradient Heptane/CH$_2$Cl$_2$) to yield 7.3 g of pure 15 as a black solid.

Yield 67%;

RMN 1H (CDCl3, δ ppm): 0.85-1.00 (m, 18H), 1.2-1.5 (m, 52H), 1.67 (m, 4H), 1.88 (m, 2H), 2.63 (t, 4H), 3.76 (m, 4H), 6.84 (d, 2H, J=1.10 Hz), 6.86 (d, 2H, J=1.83 Hz), 7.23-7.30 (m, 4H), 9.12 (d, 2H, J=8.42 Hz).

p)

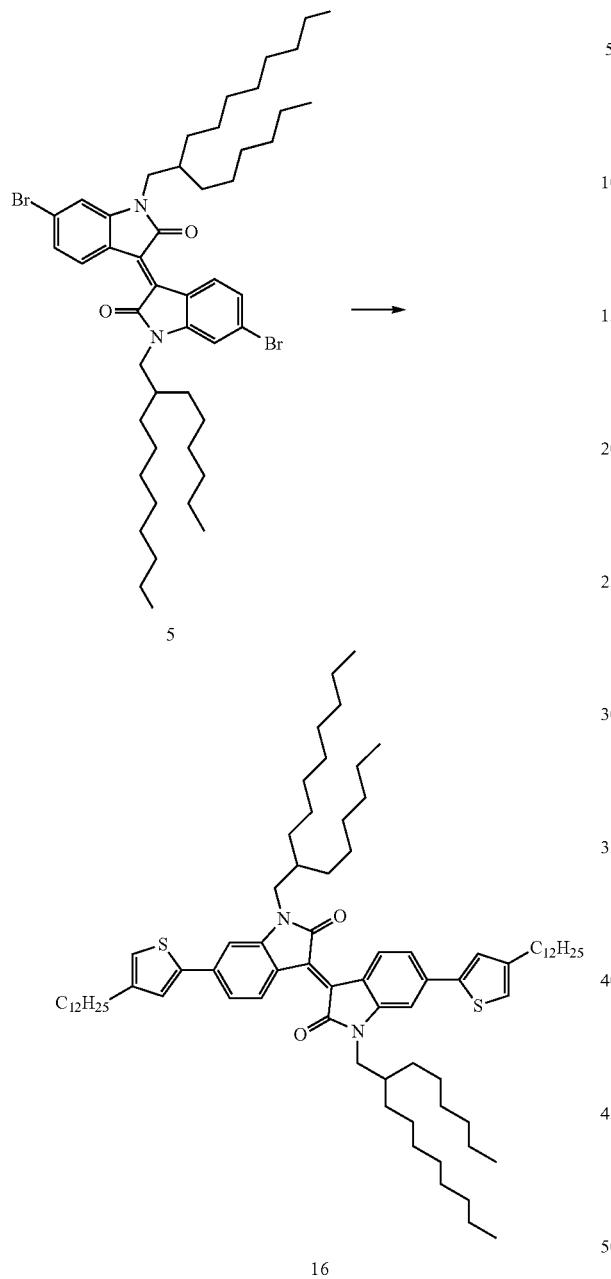

q)

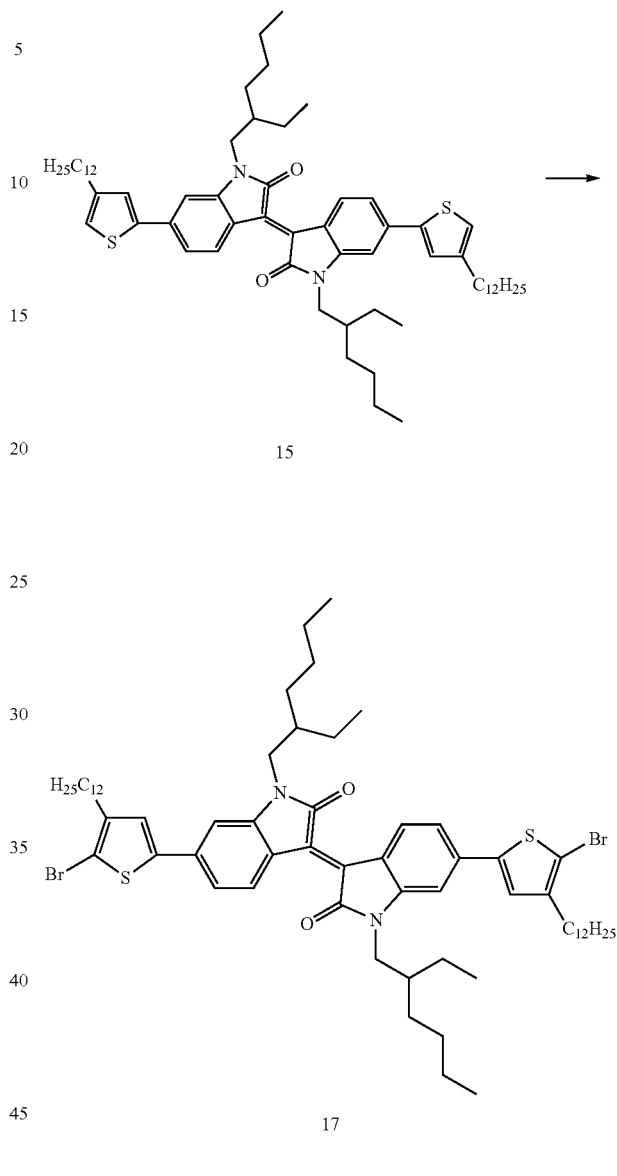

Under nitrogen, with 150 mL of toluene, 10.6 g (12.2 mmol, 1 eq) of 5, 16.5 g of 2-tributylstannyl-4-dodecylthiophene (30.5 mmol, 2.5 eq) and 1.4 g of Pd(Ph$_3$)$_4$ (1.2 mmol, 0.1 eq) are stirred overnight at 120° C. Then, the solvent is removed under vacuum and the resulting dark oil is purified over silica gel (gradient Heptane/CH$_2$Cl$_2$) to yield 13 g of pure 16 as a black solid.

Yield 89%;

RMN 1H (CDCl3, δ ppm): 0.85-1.00 (m, 18H), 1.2-1.5 (m, 86H), 1.59 (m, 4H), 1.92 (m, 2H), 2.56 (t, 4H), 3.61 (d, 4H), 6.84 (d, 2H, J=1.15 Hz), 6.87 (d, 2H, J=1.87 Hz), 7.20-7.27 (m, 4H), 9.10 (d, 2H, J=8.54 Hz).

1.8 g of NBS (10 mmol, 2. eq) is added to a solution of 5 g of 15 (5 mmol) in THF (60 mL). The mixture is then stirred for 5 h. After aqueous work-up the solvent is removed under vacuum and the resulting product is dissolved in CHCl$_3$ and precipitated in MeOH to yield the corresponding pure 17 as a black solid.

Yield=97%

RMN 1H (CDCl3, δ ppm): 0.85-1.00 (m, 18H), 1.2-1.5 (m, 52H), 1.59 (m, 4H), 1.92 (m, 2H), 2.58 (t, 4H), 3.70 (m, 4H), 6.86 (d, 2H, J=1.47 Hz), 7.08 (s, 2H), 7.13 (dd, 2H, J=8.50, 1.47 Hz), 9.13 (d, 2H, J=8.50 Hz).

r)

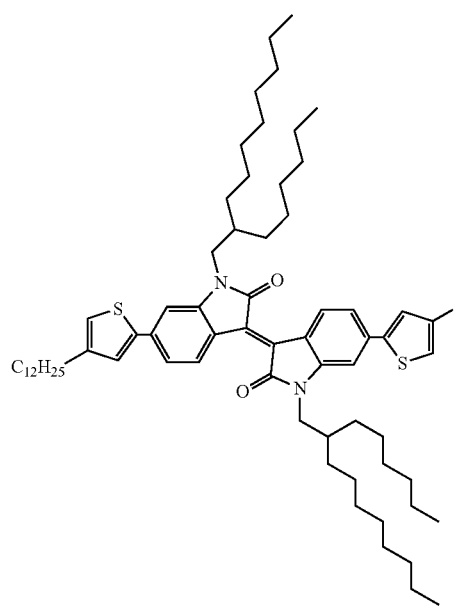

16

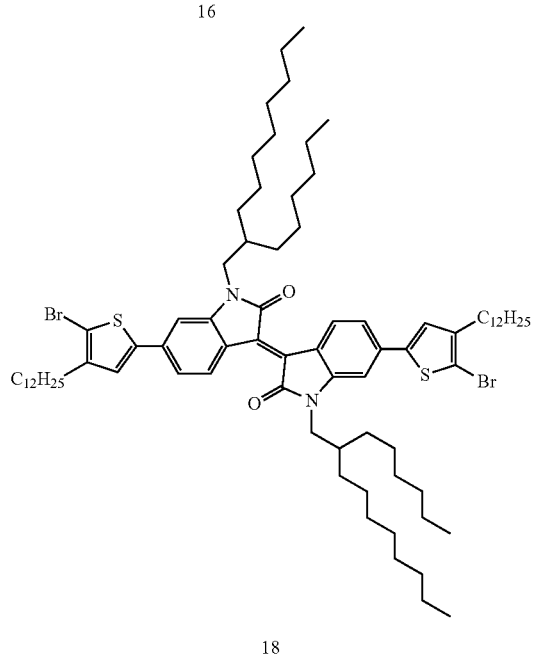

18

2.1 g of NBS (11.9 mmol, 2.05 eq) is added to a solution of 7 g of 16 (5.8 mmol) in THF (60 mL). The mixture is then stirred for 5 h. After aqueous work-up the solvent is removed under vacuum and the resulting product is dissolved in CHCl$_3$ and precipitated in MeOH to yield the corresponding pure 18 as a black solid.

Yield=87%

RMN 1H (CDCl3, δ ppm): 0.85-1.00 (m, 18H), 1.2-1.5 (m, 86H), 1.59 (m, 4H), 1.92 (m, 2H), 2.53 (t, 4H), 3.60 (d, 4H), 6.78 (d, 2H, J=1.47 Hz), 7.01 (s, 2H), 7.11 (dd, 2H, J=8.50, 1.47 Hz), 9.07 (d, 2H, J=8.50 Hz).

s)

17

19

Under nitrogen, with 100 mL of toluene, 5.6 g (4.8 mmol, 1 eq) of 17, 4.5 g of 2-tributylstannylthiophene (12.2 mmol, 2.5 eq) and 560 mg of Pd(Ph$_3$)$_4$ (480 μmol, 0.1 eq) are stirred overnight at 120° C. Then, the solvent is removed under vacuum and the resulting dark solid is purified over silica gel (gradient Heptane/CH$_2$Cl$_2$) to yield 4.6 g of pure 19 as a black solid.

Yield 84%;

RMN 1H (CDCl3, δ ppm): 0.85-1.00 (m, 18H), 1.2-1.5 (m, 52H), 1.67 (m, 4H), 1.86 (m, 2H), 2.78 (t, 4H), 3.72 (m, 4H), 7.03 (d, 2H, J=1.83 Hz), 7.09 (dd, 2H, J=5.13, 3.68 Hz), 7.18 (dd, 2H, J=3.68, 1.11 Hz), 7.28 (dd, 2H, J=8.42, 1.83 Hz), 7.33 (dd, 2H, J=5.13, 1.11 Hz), 9.12 (d, 2H, J=8.42 Hz).

t)

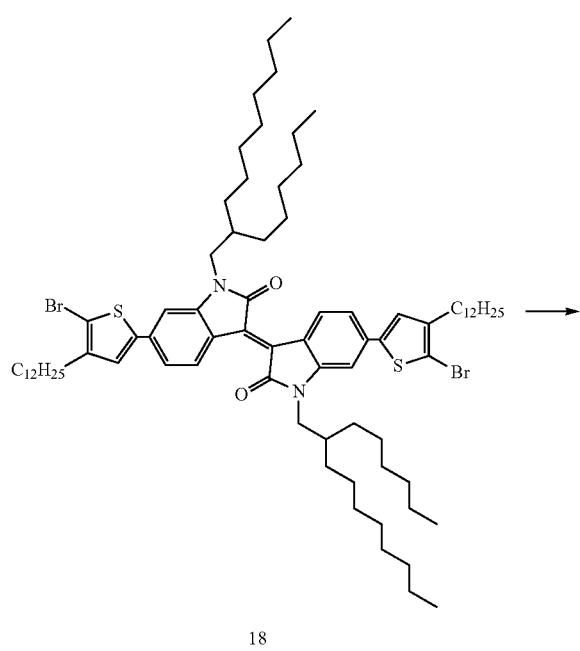

18

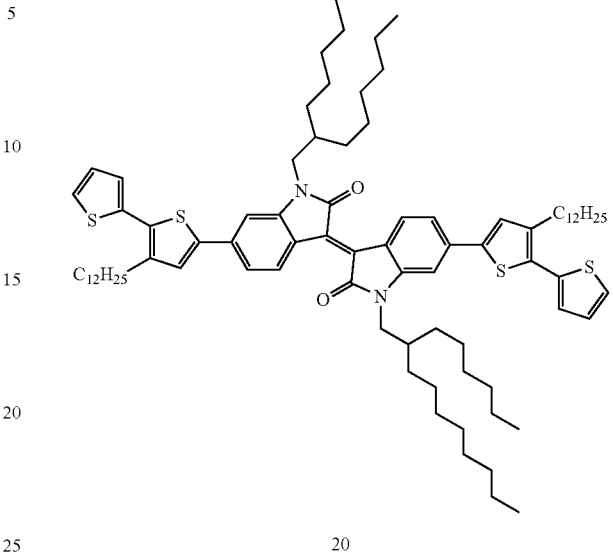

20

Under nitrogen, with 60 mL of toluene, 3 g (2.2 mmol, 1 eq) of 18, 2 g of 2-tributylstannyl-4-dodecylthiophene (5.3 mmol, 2.5 eq) and 250 mg of Pd(Ph$_3$)$_4$ (210 µmol, 0.1 eq) are stirred overnight at 120° C. Then, the solvent is removed under vacuum and the resulting dark oil is purified over silica gel (gradient Heptane/CH$_2$Cl$_2$) to yield 2.8 g of pure 20 as a black solid.

Yield 93%;

RMN 1H (CDCl3, δ ppm): 0.85-1.00 (m, 18H), 1.2-1.5 (m, 86H), 1.65 (m, 4H), 1.83 (m, 2H), 2.77 (t, 4H), 3.71 (d, 4H), 7.04 (d, 2H, J=1.42 Hz), 7.10 (dd, 2H, J=5.15, 3.74 Hz), 7.18 (dd, 2H, J=3.74, 1.52 Hz), 7.24 (dd, 2H, J=8.54, 1.42 Hz), 7.32 (dd, 2H, J=5.15, 1.52 Hz), 9.10 (d, 2H, J=8.54 Hz).

u)

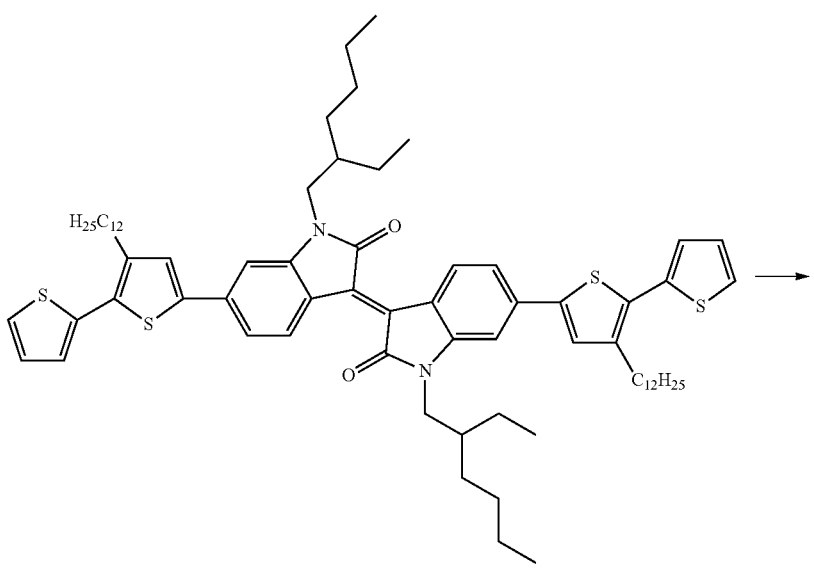

19

21

1.5 g of NBS (8.7 mmol, 2 eq) is added to a solution of 5 g of 19 (4.3 mmol, 1 eq) in THF (100 mL). The mixture is then stirred for 5 h. After aqueous work-up the solvent is removed under vacuum and the resulting product is dissolved in CHCl$_3$ and precipitated in MeOH to yield the corresponding pure 21 as a black solid.

Yield=79%

RMN 1H (CDCl3, δ ppm): 0.85-1.00 (m, 18H), 1.2-1.5 (m, 52H), 1.68 (m, 4H), 1.83 (m, 2H), 2.71 (t, 4H), 3.64 (m, 4H), 6.85 (d, 2H, J=1.47 Hz), 6.90 (d, 2H, J=3.87 Hz), 7.03 (d, 2H, J=3.87Hz), 7.18 (s, 2H), 7.22 (dd, 2H, J=8.49, 1.47 Hz), 9.09 (d, 2H, J=8.49 Hz).

v)

-continued

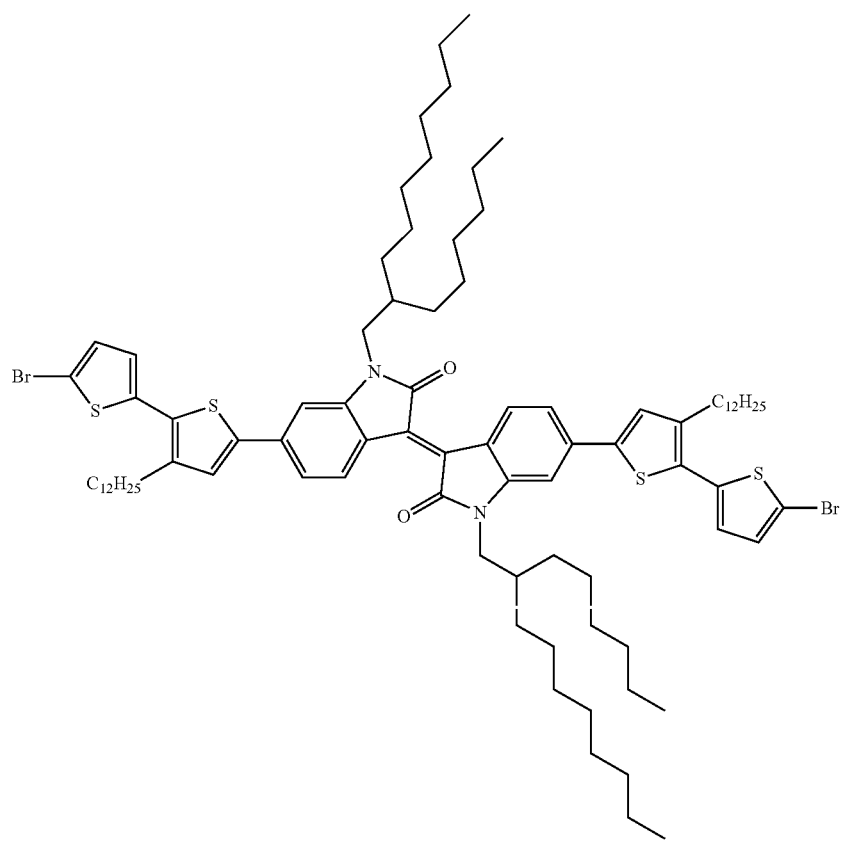

260 mg of NBS (725 µmol, 2 eq) is added to a solution of 1 g of 20 (1.5 mmol, 1 eq) in THF (50 mL). The mixture is then stirred for 5 h. After aqueous work-up the solvent is removed under vacuum and the resulting product is dissolved in CHCl₃ and precipitated in MeOH to yield the corresponding pure 22 as a black solid.

Yield=66%

RMN 1H (CDCl3, δ ppm): 0.85-1.00 (m, 18H), 1.2-1.5 (m, 86H), 1.68 (m, 4H), 1.83 (m, 2H), 2.73 (t, 4H), 3.70 (d, 4H), 6.91 (d, 2H, J=4.10 Hz), 6.94 (d, 2H, J=1.76 Hz), 7.03 (d, 2H, J=4.10 Hz), 7.22 (s, 2H), 7.26 (dd, 2H, J=8.43, 1.76 Hz), 9.16 (d, 2H, J=8.43 Hz).

w)

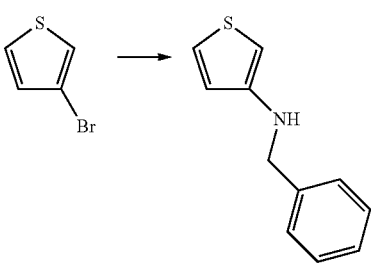

40 g (245 mmol, 1 eq) of 3-bromothiophene, 39.5 g (370 mmol, 1.5 eq) of benzylamine, 1.5 g (25 mmol, 0.1 eq) of copper, 4.6 g (25 mmol, 0.1 eq) of CuI and 105 g (490 mmol, 2 eq) of K$_3$PO$_4$ are stirred in dimethylaminoethanol (220 mL) under nitrogen for 48h at 80° C. Then the mixture is filtrated and dimethylaminoethanol is removed under vacuum. The resulting black oil is distilled under vacuum to yield 23 as colorless liquid.

Yield 43%;

x)

[Structure: 23 → 24]

10 g (52.8 mmol, 1 eq) of 23 in 40 mL of CH$_2$Cl$_2$ are dropwise added to 8.7 g (68.7 mmol, 1.3 eq) of oxalyl chloride in 60 mL of CH$_2$Cl$_2$ at −10° C. After 30 min, 18 mL of triethylamine dissolved in 40 mL of CH$_2$Cl$_2$ are dropwise added and the mixture is stirred overnight. Then, the solvent is removed under vacuum and the resulting black oil is purified over silica gel (gradient Heptane/CH$_2$Cl$_2$) to yield 6.5 g of pure 24 as a red solid.

Yield 53%;

y)

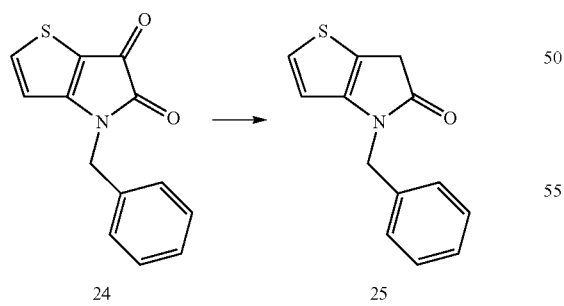

3 g (12.3 mmol, 1 eq) of 24 and 800 mg (12.3 mmol, 1 eq) of sodium ethanolate are stirred overnight at reflux with 15 mL of hydrazine and 30 mL of ethanol. Then, the solvent is removed under vacuum and the resulting yellow oil is purified over silica gel (gradient Heptane/CH$_2$Cl$_2$) to yield 2.1 g of pure 25 as a pale yellow solid.

Yield 74%;

z)

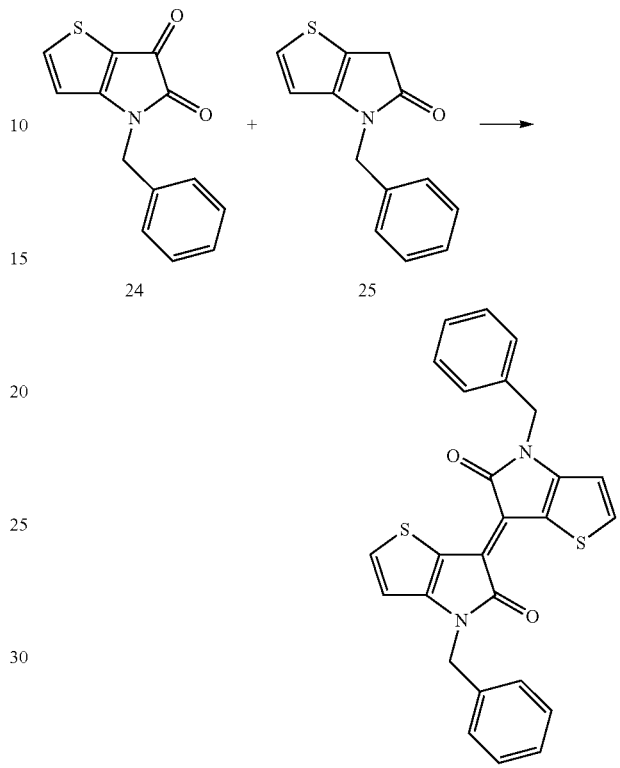

2.2 g (12.3 mmol, 1 eq) of 24 and 2.1 g (9.2 mmol, 1 eq) of 25 are stirred for 48 h at reflux in 40 mL of acetic acid. Then the mixture is poured in water and the solid filtrated and washed several times with water and ethanol. The solid is dissolved in a minimum of chloroform and precipitated in heptane to yield 3.9 g of pure 26 as a dark violet powder.

Yield 93%;

aa)

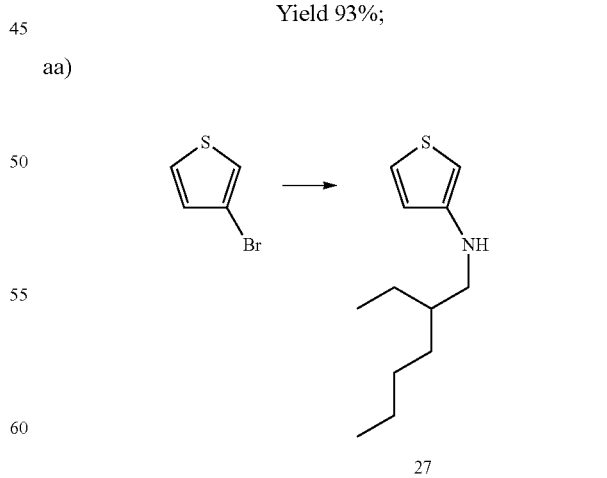

16.3 g (100 mmol, 1 eq) of 3-bromothiophene, 19.4 g (150 mmol, 1.5 eq) of 2-ethylhexylamine, 320 mg (5 mmol, 0.05 eq) of copper, 950 mg (5 mmol, 0.05 eq) of CuI and 12.3 g (200 mmol, 2 eq) of K$_3$PO$_4$ are stirred in dimethylaminoethanol (100 mL) under nitrogen for 48 h at 80° C. Then the mixture is filtrated and dimethylaminoethanol is removed under vacuum. The resulting black oil is distilled under vacuum to yield 27 as colorless liquid.

hydrazine and 10 mL of ethanol. Then, the solvent is removed under vacuum and the resulting black oil is purified over silica gel (gradient Heptane/CH$_2$Cl$_2$) to yield 2.1 g of pure 29 as a pale yellow oil.

Yield 35%;

ab)

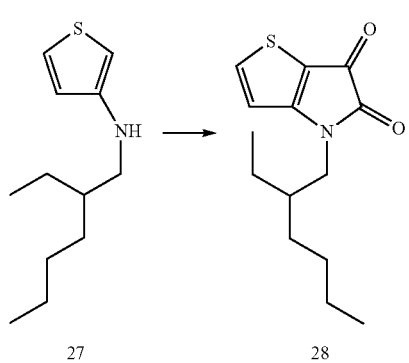 [SMILES: CCCCC(CC)CNc1ccsc1 ; CCCCC(CC)CN1C(=O)C(=O)c2sccc21]

Yield 67%;

ad)

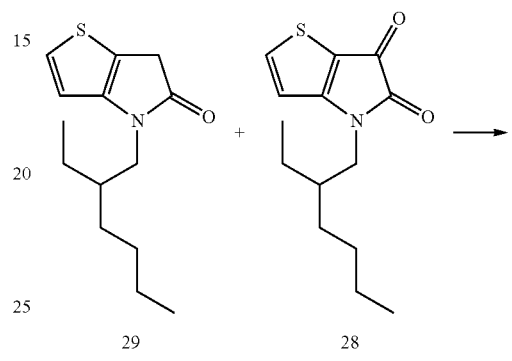

6.1 g (28.9 mmol, 1 eq) of 27 in 20 mL of CH$_2$Cl$_2$ are dropwise added to 4.8 g (37.5 mmol, 1.3 eq) of oxalyl chloride in 40 mL of CH$_2$Cl$_2$ at 0° C. After 30 min, 10 mL of triethylamine dissolved in 10 mL of CH$_2$Cl$_2$ are dropwise added and the mixture is stirred overnight. Then, the solvent is removed under vacuum and the resulting black oil is purified over silica gel (gradient Heptane/CH$_2$Cl$_2$) to yield 6.5 g of pure 28 as red oil.

Yield 64%;

ac)

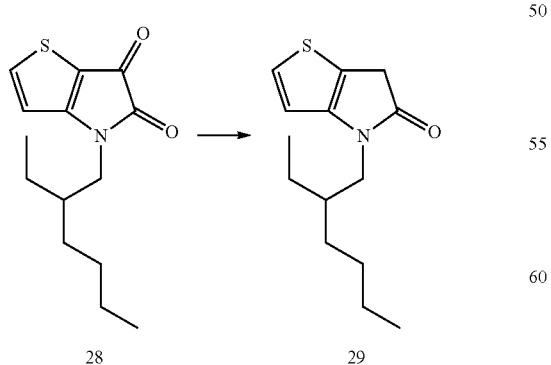

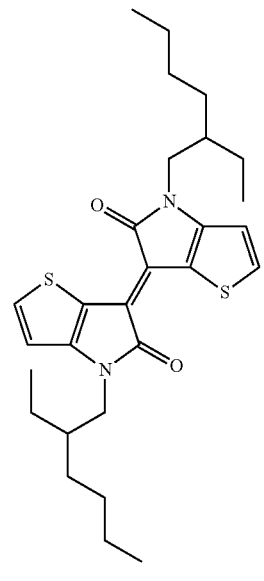

2 g (7.5 mmol, 1 eq) of 28 and 510 mg (7.5 mmol, 1 eq) of sodium ethanolate are stirred overnight at reflux with 7 mL of 1 g (3.7 mmol, 1 eq) of 28 and 950 mg (3.7 mmol, 1 eq) of 29 are stirred for 48 h at reflux in 20 mL of acetic acid. Then the mixture is poured in water and the solid filtrated and washed several times with water and ethanol. The solid is purified over silica gel (gradient Heptane/CH$_2$Cl$_2$) to yield 1.7 g of pure 30 as a dark violet powder.

Yield 93%;

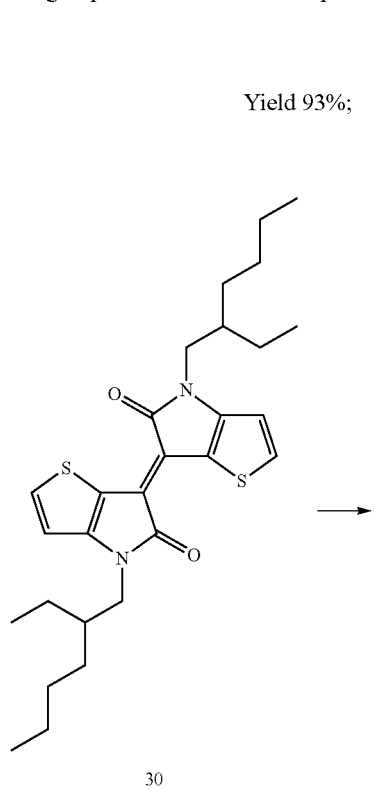

30

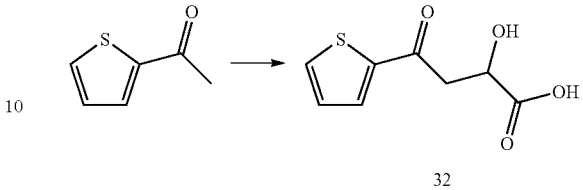

1.05 g of NBS (6 mmol, 2 eq) is added to a solution of 1.5 g of 27 (3 mmol, 1 eq) in THF (30 mL). The mixture is then stirred for 5 h. After aqueous work-up the solvent is removed under vacuum and the resulting product is dissolved in CHCl$_3$ and precipitated in MeOH to yield the corresponding pure 28 as a dark violet powder.

Yield=87% af)

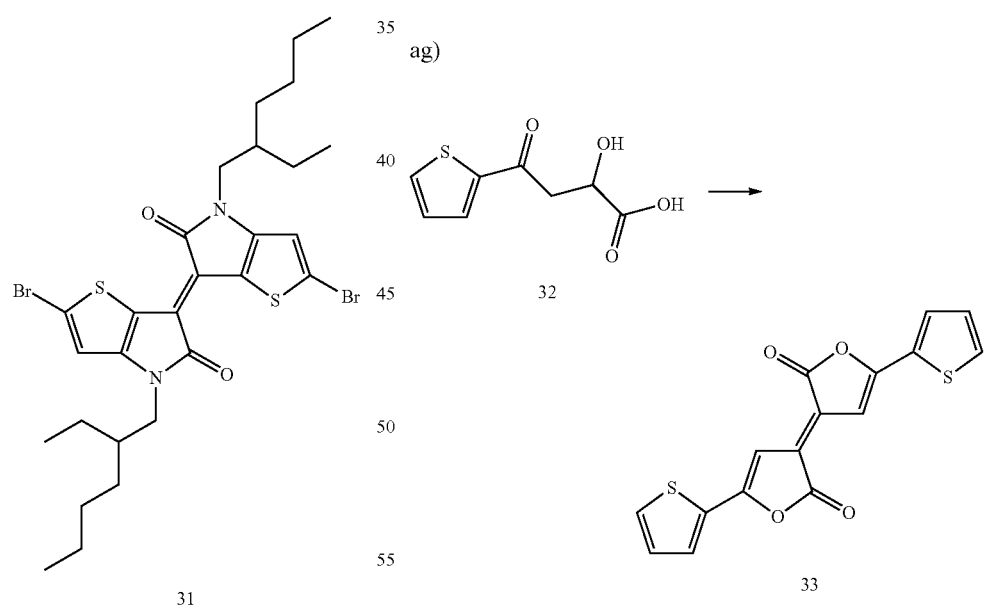

22.2 g (0.15 mol, 1 eq) of a 50% solution of glyoxlic acid in water are heated under vacuum (50 mmHg) until 80% of the water is removed. Then, 37.8 g (0.3 mol, 2 eq) of 2-acetylthiophene is added and the mixture is heated under vacuum for 2 h. When cooled down to room temperature, 100 mL of water and 8.7 g of Na$_2$CO$_3$ are added and the aqueous phase is washed several times with ether and then acidified to a pH value around 1 and extracted several times with ethyl acetate. The organic phases are dried over Na$_2$SO$_4$ and evaporated to yield 19.8 g of pure 32 as pale yellow oil.

Yield=66% ag)

10 g (50 mmol, 1 eq) of 32, 2 g (37 mmol, 0.75 eq) of NH$_4$Cl, 1.8 g (19 mmol, 0.38 eq) of CuCl are stirred in acetic anhydride (50 mL) for 2 h at reflux. Then, when cooled down, the mixture is filtrated and the resulting black purple powder is washed several times with water, ethanol and ether and recristallised in acetic acid.

Yield=67%;

ah)

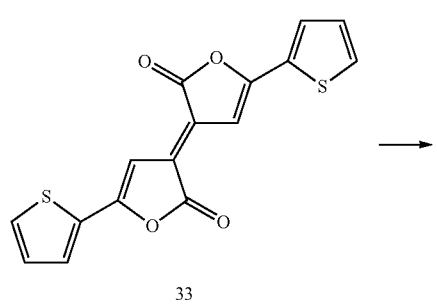

33

→

34

1 g (2.05 mmol, 1 eq) of 33 and 0.92 g (6.2 mmol, 3 eq) of 4-butylaniline are stirred in acetic acid (50 mL) for 2h at reflux. Then, when cooled down, water and CH$_2$Cl$_2$ are added and the organic phase is washed several times with water, dried over Na$_2$CO$_3$ and evaporated. The resulting brown oil is purified over silicagel (gradient Heptane/CH$_2$Cl$_2$) to yield 180 mg of pure 34 as a blue powder.

Polymers ai)

15

→

P1

Under nitrogen, 1.3 g (8.1 mmol, 4 eq) of FeCl$_3$ in 15 mL of nitromethane are added dropwise to a solution of 2 g (2 mmol, 1 eq) of 15 in 60 mL of dry chlorobenzene. The mixture is stirred overnight at 50° C. Then, the mixture is poured in MeOH and the solid is washed with a Soxhlet apparatus by using MeOH, Et$_2$O and CHCl$_3$. The chloroform fraction is precipitated in MeOH to yield 530 mg of P1 as a black-green powder.

Yield=81%;

$M_n$=2.24 $10^4$ g·mol$^{-1}$, $M_w$=1.41 $10^5$ g·mol$^{-1}$, $M_Z$=4.11 $10^5$ g·mol$^{-1}$.

average number of monomer units in product=22 aj) Under nitrogen, 790 mg (2.9 mmol, 1.25 eq) of Ni(COD)$_2$ and 450 mg of bipyridine (2.9 mmol, 1.25 eq) in 30 mL of toluene are added to a solution of 3 g (2.3 mmol, 1 eq) of 21 in 70 mL of toluene. The mixture is stirred overnight at 80° C. Then, the solution is poured on 300 mL of a 1/1/1 methanol/acetone/HCl 4N mixture and stirred for 1 h. the precipitate is

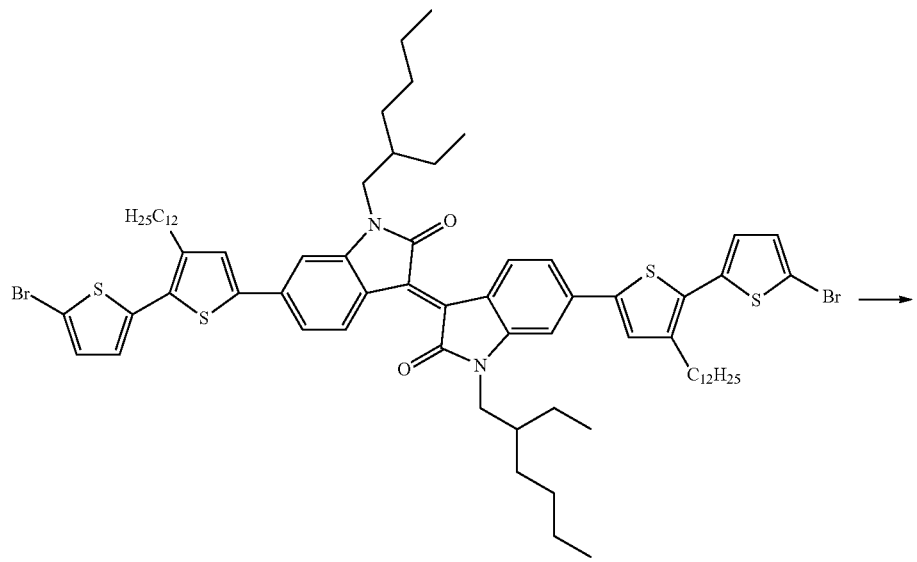

21

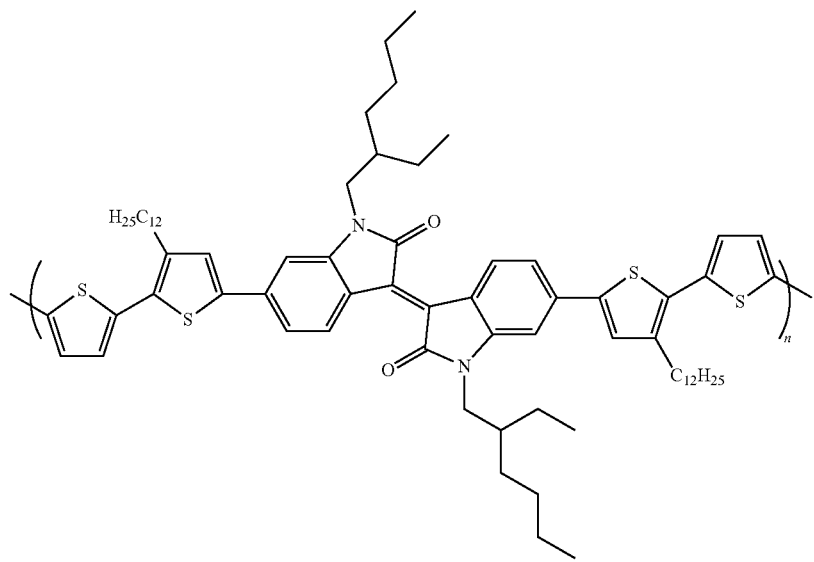

P2 then filtrated, dissolved in CHCl$_3$ and stirred vigourously at 60° C. with an aqueous solution of ethylenediaminetetraacetic acid (EDTA) tetrasodium salt for one additional hour. The organic phase is washed with water, concentrated and precipitated in methanol. The residue is purified by soxhlet extraction using methanol, hexane and CHCl$_3$. The chloroform fraction is precipitated in MeOH to yield 700 mg of P2 as a black-green powder.

Yield=27%;

$M_n$=1.07 10$^4$ g·mol$^{-1}$, $M_w$=2.11 10$^4$ g·mol$^{-1}$, $M_Z$=3.97 10$^4$ g·mol$^{-1}$.

Average number of monomer units in product=17 ak)

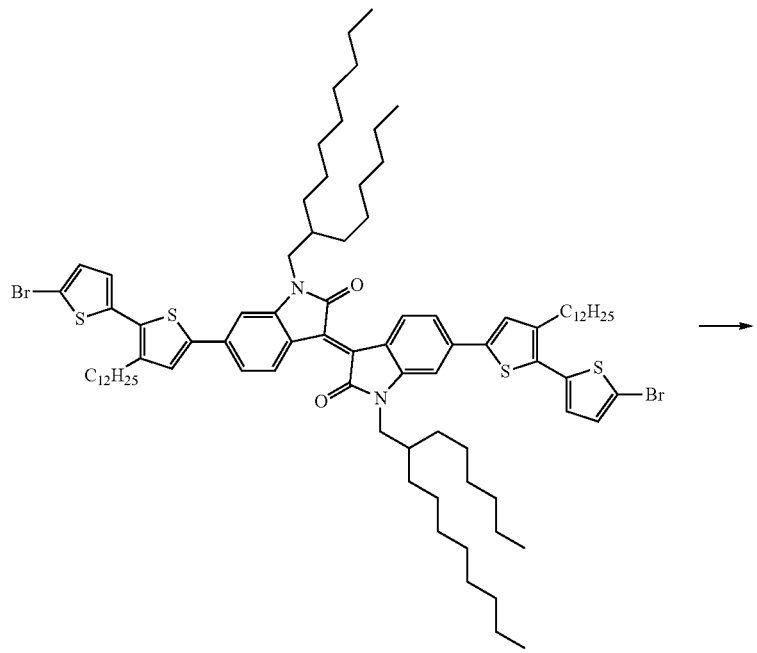

22

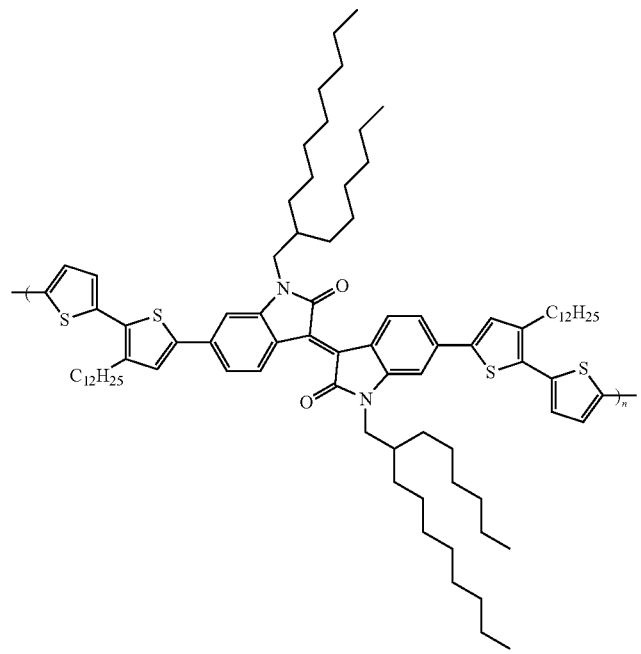

P3

Under nitrogen, 260 mg (940 μmol, 1.25 eq) of Ni(COD)$_2$ and 150 mg of bipyridine (940 μmol, 1.25 eq) in 15 mL of toluene are added to a solution of 1.15 g (750 μmol, 1 eq) of 22 in 35 mL of toluene. The mixture is stirred overnight at 80° C. Then, the solution is poured on 100 mL of a 1/1/1 methanol/acetone/HCl 4N mixture and stirred for 1 h. the precipitate is then filtered, dissolved in CHCl$_3$ and stirred vigourously at 60° C. with an aqueous solution of ethylenediaminetetraacetic acid (EDTA) tetrasodium salt for one additional hour. The organic phase is washed with water, concentrated and precipitated in methanol. The residue is purified by soxhlet extraction using methanol, hexane and CHCl$_3$. The chloroform fraction is precipitated in MeOH to yield 660 mg of P3 as a black-blue powder.

Yield=66%;

$M_n$=1.56 10$^4$ g·mol$^{-1}$, $M_w$=2.61 10$^4$ g·mol$^{-1}$, $M_z$=4.75 10$^4$ g·mol$^{-1}$.
Average number of monomer units in product=19
al)

Under nitrogen, with 40 mL of THF and 8 mL of water, 2.00 g (2.3 mmol, 1 eq) of 3, 0.584 g (2.3 mmol, 1 eq) of bispinacolatodiboran, 53 mg (57 μmol, 0.025 eq) of Pd$_2$dba$_3$, 33 mg (115 μmol, 0.05 eq) of tBu$_3$PBF$_4$ and 1.9 g (8.7 mmol, 4 eq) of K$_3$PO$_4$ are stirred overnight at 80° C. Then, the solution is poured on 100 mL of a 1/1/1 methanol/acetone/HCl 4N mixture and stirred for 1 h. the precipitate is then filtrated, dissolved in CHCl$_3$ and stirred vigourously at 60° C. with an aqueous solution of sodium cyanide for one additional hour. The organic phase is washed with water, concentrated and precipitated in methanol. The residue is purified by soxhlet extraction using methanol, ether and CHCl$_3$. The chloroform fraction is precipitated in MeOH to yield 1.3 g of P4 as a black powder.

Yield=79%;

$M_n$=4.95 10$^4$ g·mol$^{-1}$, $M_w$=2.00 10$^4$ g·mol$^{-1}$.
Average number of monomer units in product=70
am)

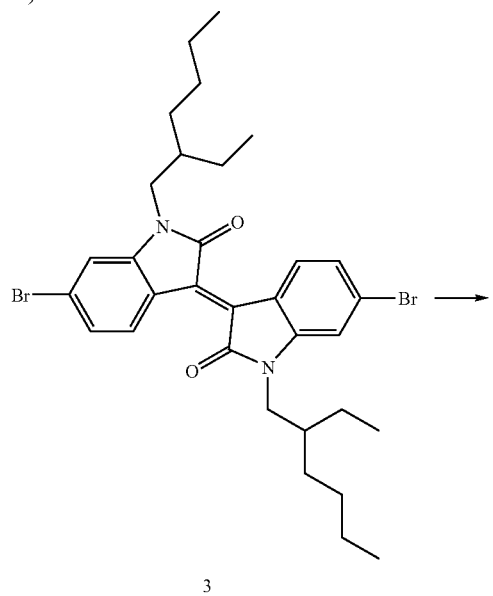

3

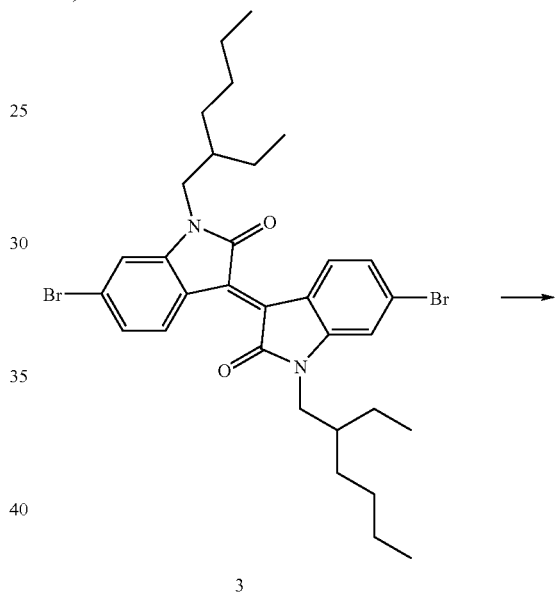

3

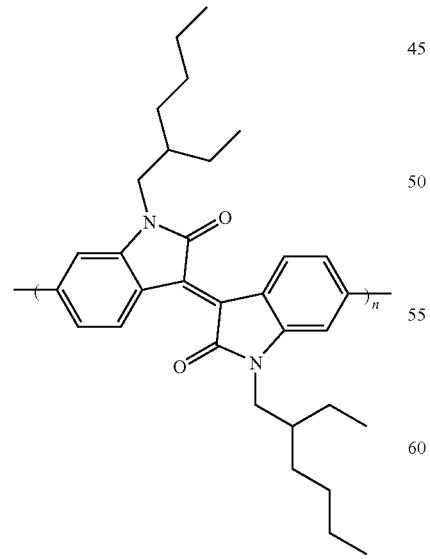

P4

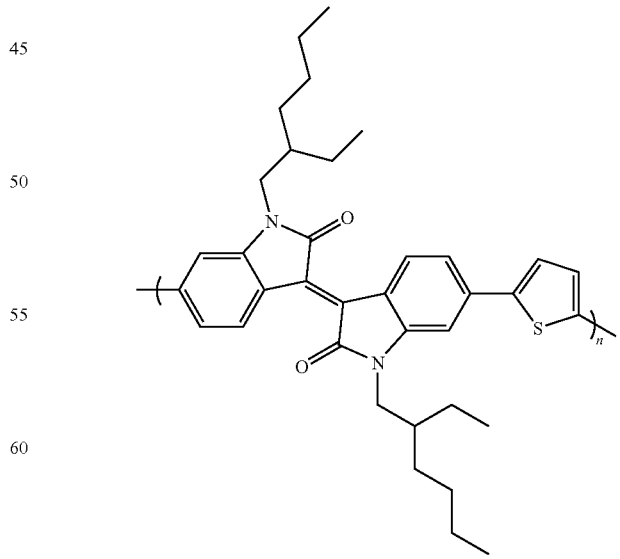

P5

Under nitrogen, with 20 mL of THF and 3 mL of water, 1.00 g (1.15 mmol, 1 eq) of 3, 0.386 g (1.15 mmol, 1 eq) of 2,5-bis(4,4,5,5-tetramethyl-1,3,2-dioxaborolan-2-yl)-thiophene, 26 mg (29 μmol, 0.025 eq) of Pd$_2$dba$_3$, 17 mg (57 μmol, 0.05 eq) of tBu$_3$PBF$_4$ and 0.73 g (3.5 mmol, 3 eq) of K$_3$PO$_4$ are stirred overnight at 80° C. Then, the solution is poured on 60 mL of a 1/1/1 methanol/acetone/HCl 4N mixture and stirred for 1 h. the precipitate is then filtrated, dissolved in CHCl$_3$ and stirred vigourously at 60° C. with an aqueous solution of sodium cyanide for one additional hour. The organic phase is washed with water, concentrated and precipitated in methanol. The residue is purified by soxhlet extraction using methanol, ether and CHCl$_3$. The chloroform fraction is precipitated in MeOH to yield 640 mg of P4 as a black powder.

Yield=71%;

$M_n$=2.6 10$^5$ g·mol$^{-1}$, $M_w$=5.9 10$^4$ g·mol$^{-1}$.
Average number of monomer units in product=320
an)

Under nitrogen, with 20 mL of THF and 3 mL of water, 1.00 g (1.15 mmol, 1 eq) of 3, 0.491 g (1.15 mmol, 1 eq) of 5,5'-bis(4,4,5,5-tetramethyl-1,3,2-dioxaborolan-2-yl)-2,2'-bithiophene, 26 mg (29 μmol, 0.025 eq) of Pd$_2$dba$_3$, 17 mg (57 μmol, 0.05 eq) of tBu$_3$PBF$_4$ and 0.73 g (3.5 mmol, 3 eq) of K$_3$PO$_4$ are stirred overnight at 80° C. Then, the solution is poured on 60 mL of a 1/1/1 methanol/acetone/HCl 4N mixture and stirred for 1 h. the precipitate is then filtrated, dissolved in CHCl$_3$ and stirred vigourously at 60° C. with an aqueous solution of sodium cyanide for one additional hour. The organic phase is washed with water, concentrated and precipitated in methanol. The residue is purified by soxhlet extraction using methanol, ether and CHCl$_3$. The chloroform fraction is precipitated in MeOH to yield 170 mg of P6 as a black powder.

Yield=17%;

$M_n$=7.7 10$^3$ g·mol$^{-1}$, $M_w$=5.0 10$^3$ g·mol$^{-1}$.
Average number of monomer units in product=8
ao)

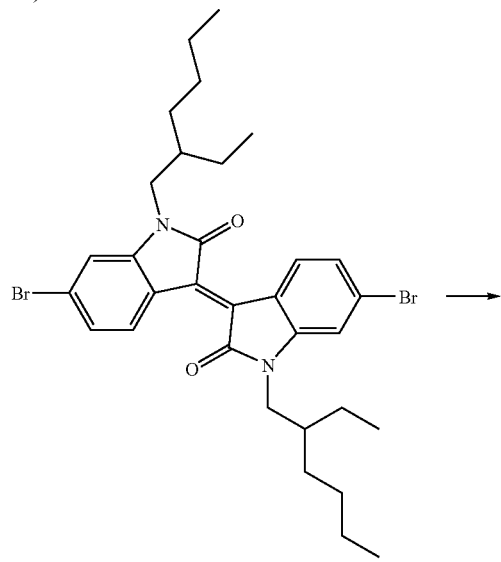

3

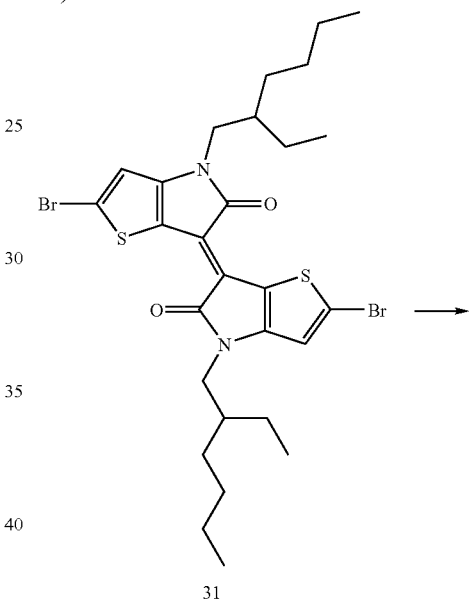

31

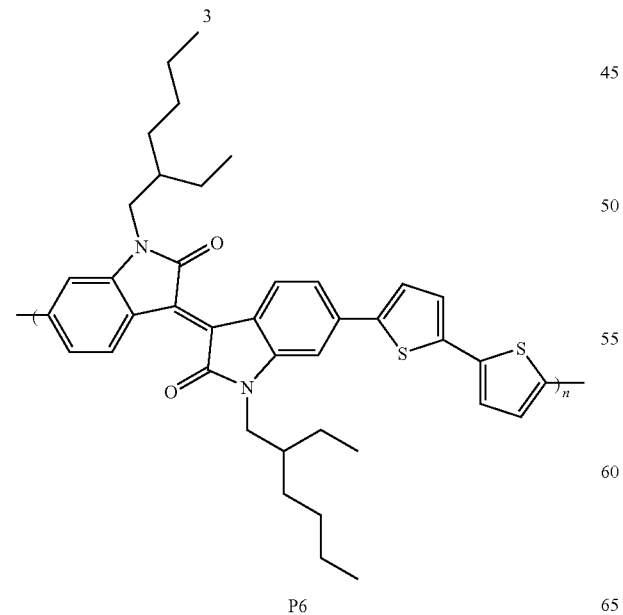

P6

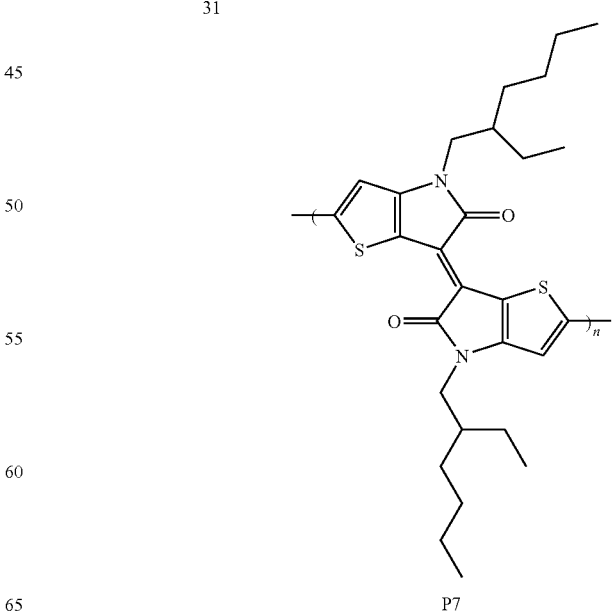

P7

Under nitrogen, with 25 mL of THF and 5 mL of water, 1.00 g (1.5 mmol, 1 eq) of 31, 0.387 g (1.5 mmol, 1 eq) of bispinacolatodiboran, 34 mg (38 µmol, 0.025 eq) of Pd$_2$dba$_3$, 21 mg (76 µmol, 0.05 eq) of tBu$_3$PBF$_4$ and 0.95 g (8.7 mmol, 4 eq) of K$_3$PO$_4$ are stirred overnight at 80° C. Then, the solution is poured on 50 mL of a 1/1/1 methanol/acetone/HCl 4N mixture and stirred for 1 h. the precipitate is then filtrated, dissolved in CHCl$_3$ and stirred vigourously at 60° C. with an aqueous solution of sodium cyanide for one additional hour. The organic phase is washed with water, concentrated and precipitated in methanol. The residue is purified by soxhlet extraction using methanol, ether and CHCl$_3$. The chloroform fraction is precipitated in MeOH to yield 510 mg of P7 as a black powder.

Yield=69%;

$M_n$=3.2 10$^4$ g·mol$^{-1}$, $M_w$=2.0 10$^4$ g·mol$^{-1}$.
Average number of monomer units in product=64.

Application Examples

Polymer X, Y and Z Based Field-Effect Transistors a) Experimental:
Bottom-gate thin-film transistor (TFT) structures with p—Si gate are used for all experiments. A high-quality thermal SiO2 layer serves as gate-insulator of $C_i$=32.6 nF/cm2 capacitance per unit area. Source and drain electrodes are patterned by photolithography directly on the gate-oxide (bottom-contact configuration). On each substrate 16 transistors are present with Au source/drain electrodes defining channels of different length. Prior to the deposition of the organic semiconductor, the SiO2 surface is derivatized with hexamethyldisilazane (HMDS) or octadecyltrichlorosilane (OTS). The films are prepared either by spin casting or drop casting the polymer obtained in example w), x), y) in different solvents. The transistor behaviour is measured on an automated tester elaborated by CSEM, Transistor Prober TP-10.
b) Transistor Performance:
P1:
The thin-film transistors show p-type transistor behavior. From a linear fit to the square root of the saturated transfer characteristics, a field-effect mobility of 9*10$^{-5}$cm$^2$/Vs is determined.
The transistors show a threshold voltage of about −7 V. The transistors show on/off current ratios of 10$^3$.
P2:
The thin-film transistors show p-type transistor behavior. From a linear fit to the square root of the saturated transfer characteristics, a field-effect mobility of 2.5.*10$^{-3}$cm$^2$/Vs is determined. The transistors show a threshold voltage of −6 V. The transistors show good on/off current ratios of 1.8*10$^4$.
Annealing of the sample results in a drastic increase of the performance (especially mobility), which can be correlated to a better aggregation of the polymer in the solid state.
Testing of a set of OFETs after 2 months exposed in air conditions shows remarkable stability as the mobility is almost constant. The on/off ratio, which usually suffer the most, is only reduced by a factor of 10.
P3:
The thin-film transistors show p-type transistor behavior. From a linear fit to the square root of the saturated transfer characteristics, a field-effect mobility of 9.*10$^{-3}$cm$^2$/Vs is determined.
The transistors show a threshold voltage of −5 V. The transistors show good on/off current ratios of 8.5*10$^4$.

Annealing of the sample results in a drastic increase of the performance (especially mobility), which can be correlated to a better aggregation of the polymer in the solid state.
Testing of a set of OFETs after 2 months exposed in air conditions shows remarkable stability as the mobility is almost constant. The on/off ratio is only reduced by a factor of 10.
P4:
The thin-film transistors show p-type transistor behavior. From a linear fit to the square root of the saturated transfer characteristics, a field-effect mobility of 2.*10$^{-5}$cm$^2$/Vs is determined.
The transistors show a threshold voltage of 3 V. The transistors show good on/off current ratios of 1.2*10$^4$
P5:
The thin-film transistors show p-type transistor behavior. From a linear fit to the square root of the saturated transfer characteristics, a field-effect mobility of 4.*10$^{-4}$cm$^2$/Vs is determined.
The transistors show a threshold voltage of −13 V. The transistors show on/off current ratios of 8*10$^3$
P6:
The thin-film transistors show p-type transistor behavior. From a linear fit to the square root of the saturated transfer characteristics, a field-effect mobility of 5.*10$^{-4}$cm$^2$/Vs is determined.
The transistors show a threshold voltage of −5 V. The transistors show good on/off current ratios of 7*10$^3$
P7:
The thin-film transistors show p-type transistor behavior. From a linear fit to the square root of the saturated transfer characteristics, a field-effect mobility of 2.1*10$^{-2}$cm$^2$/Vs is determined. The transistors show a threshold voltage of −11 V. The transistors show on/off current ratios of 6*10$^5$
Annealing of the sample results in a drastic increase of the performance (especially mobility), which can be correlated to a better aggregation of the polymer in the solid state.

The invention claimed is:
1. A semiconductor device which contains a layer comprising a compound of the formula (I) or an oligomer or polymer comprising repeating units of the formula (Ia)

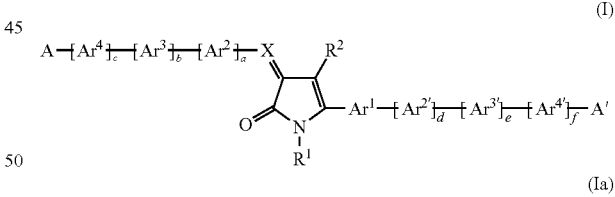

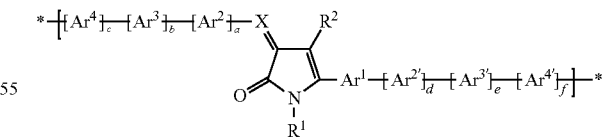

wherein a, b, c, d, e and f are from the range 0-3;
each of A, A', R$^1$, R$^2$ independently are selected from hydrogen; E; C$_1$-C$_{25}$alkyl, C$_2$-C$_{25}$alkenyl, C$_2$-C$_{24}$alkynyl, each of which may optionally be substituted by E and/or in any C,C-single bond, if present, interrupted by D; a cycloalkyl group, which can be substituted by E, one to three times by C$_1$-C$_8$alkyl, C$_1$-C$_8$thioalkoxy, or C$_1$-C$_8$alkoxy; or a cycloalkyl group, which can be condensed one or two times by unsubstituted phenyl or phenyl substituted by E, phenyl substituted one to three times by $C_1$-$C_4$-alkyl, halogen, nitro or cyano; a cycloalkenyl group; a ketone or aldehyde group; an ester group; a carbamoyl group; a silyl group; a siloxanyl group; $Ar^{10}$ or —$CR^5R^6$—$(C_jH_{2j})$—$Ar^{10}$, where j stands for 0, 1, 2, 3 or 4;

or $R^2$ and $Ar^1$, together with the vinyl moiety they are bonding to, form a ring such as an aryl or heteroaryl group, which may optionally be substituted by G;

X is CR where R is as defined for $R^1$, or is another ketopyrrole moiety of the formula (Ib)

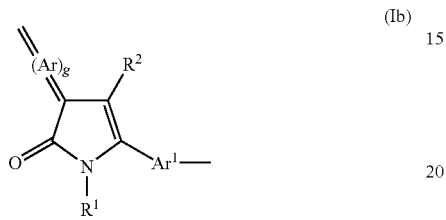

the index g is 0 or 1 and Ar, if present, is a tetravalent residue connected to the rest of the molecule by 2 chemical double bonds, and is selected from quinoid $C_6$-$C_{10}$ring systems, =$C_6H_4$=, and residues of the formula

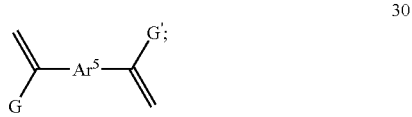

$Ar^1$, if not linked to $R^2$, and $Ar^2$, $Ar^{2'}$, $Ar^3$, $Ar^{3'}$, $Ar^4$, $Ar^{4'}$, and $Ar^5$ independently of each other are selected from divalent carbocyclic moieties of 5 to 15 carbon atoms, divalent heterocyclic moieties of 2 to 15 carbon and 1-8 heteroatoms selected from O, N, S, Si, each of said moieties containing conjugated or cross-conjugated double and/or triple bonds, or ethylenic or ethinic moieties, where each of these moieties is unsubstituted or substituted by E;

$R^5$ and $R^6$ independently from each other stand for hydrogen, fluorine, cyano or $C_1$-$C_4$alkyl, which can be substituted by fluorine, chlorine or bromine, or phenyl, which can be substituted one to three times with $C_1$-$C_4$alkyl, $Ar^{10}$ stands for aryl or heteroaryl, which may optionally be substituted by G, phenyl or 1- or 2-naphthyl which can be substituted one to three times with $C_1$-$C_8$alkyl, $C_1$-$C_8$thioalkoxy, and/or $C_1$-$C_8$alkoxy;

D is —CO—; —COO—; —S—; —SO—; —$SO_2$—; —OP(O)($OR^{29}$)O—; —OP(O)($R'^{29}$)O—; —O—; —$NR^{25}$—; —$CR^{23}$=$CR^{24}$—; or —C≡C—; and E is —$OR^{29}$; —$SR^{29}$; —$SOR^{29}$; —$SO_2R^{29}$; —$NR^{25}R^{26}$; —$COR^{28}$; —$COOR^{27}$; —$CONR^{25}R^{26}$; —CN; nitro; —OP(O)($OR^{29}$)$_2$; —OP(O)($R'^{29}$)$_2$; —Si($R^{29}$)$_3$; or halogen;

G and G' independently are E; $C_1$-$C_{18}$alkyl, which may be interrupted by D; or $C_1$-$C_{18}$alkoxy which is substituted by E and/or, if containing 2 or more carbon atoms, interrupted by D, wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—;

$R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—;

$R'^{29}$ is as defined for $R^{29}$ except that $R'^{29}$ is not H;

or a tautomer of such a compound, oligomer or polymer.

2. Semiconductor device of claim 1, wherein $Ar^1$, if not linked to $R^2$, as well as $Ar^2$, $Ar^{2'}$, $Ar^3$, $Ar^{3'}$, $Ar^4$, $Ar^{4'}$ and $Ar^5$ are independently of each other selected from

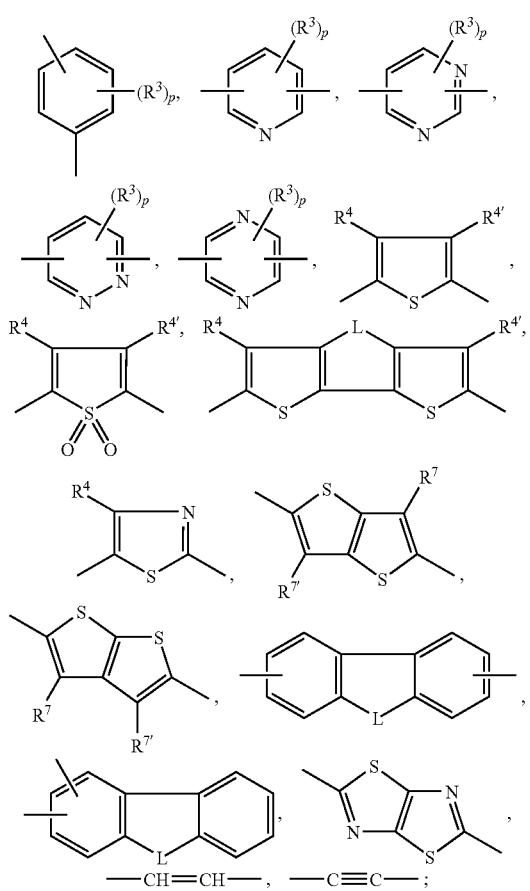

wherein L is selected from $CR^7R'^7$, C=O, C=$NR^7$, O, S, $NR^7$, $SiR^{17}R'^{17}$;

$R^3$ may be the same or different within one group and is selected from hydrogen, a residue E, $C_1$-$C_{25}$alkyl, which may optionally be substituted by E and/or, if containing 2 or more carbon atoms, interrupted by D, $C_6$-$C_{24}$aryl, which may optionally be substituted by G, $C_2$-$C_{20}$heteroaryl, which may optionally be substituted by G, $C_1$-$C_{18}$alkoxy, which may optionally be substituted by E and/or, if containing 2 or more carbon atoms, interrupted by D, $C_7$-$C_{25}$aralkyl, wherein ar (=aryl) of aralkyl may optionally be substituted by G, or —CO—$R^{28}$, or two or more groups $R^3$ which are in the neighbourhood to each other, form a ring;

$R^4$, $R^{4'}$, $R^7$ and $R^{7'}$ independently from each other stand for hydrogen, a residue E, $C_1$-$C_{25}$alkyl, which may optionally be substituted by E and/or, if containing 2 or more carbon atoms, interrupted by D, $C_6$-$C_{24}$aryl, which may optionally be substituted by G, $C_2$-$C_{20}$heteroaryl, which may optionally be substituted by G, $C_1$-$C_{18}$alkoxy, which may optionally be substituted by E and/or, if containing 2 or more carbon atoms, interrupted by D, $C_7$-$C_{25}$aralkyl, wherein ar (=aryl) of aralkyl may optionally be substituted by G, or —CO—$R^{28}$; or $R^4$ and $R^{4'}$ form a ring, and $R^{17}$ and $R'^{17}$ are as defined as $R^{29}$.

3. Semiconductor device of claim 1, wherein each aryl is selected from phenyl and thiophenyl.

4. Semiconductor device of claim 1, wherein A and A' are independently selected from hydrogen; $C_1$-$C_{25}$alkyl or $C_2$-$C_{25}$alkenyl, each of which may optionally be substituted by E and/or in a C,C-single bond, if present, interrupted by D; $Ar^{10}$ or —$CR^5R^6$—$(CH_2)_j$—$Ar^{10}$;

$Ar^{10}$ is selected from phenyl and thiophenyl;

D is —S—; —O—; —$CR^{23}$=$CR^{24}$—; and

E is —$OR^{29}$; —$SR^{29}$; —$NR^{25}R^{26}$; —CN; or halogen;

G and G' independently are E; $C_1$-$C_{18}$alkyl, which may be interrupted by D; or $C_1$-$C_{18}$alkoxy which is substituted by E and/or, if containing 2 or more carbon atoms, interrupted by D, wherein $R^{23}$, $R^{24}$, $R^{25}$ and $R^{26}$ are independently of each other H; phenyl; thiophenyl; phenyl or thiophenyl which is substituted by $C_1$-$C_{18}$alkyl, or $C_1$-$C_{18}$alkoxy; $C_1$-$C_{18}$alkyl;

$R^{29}$ is H; phenyl; thiophenyl; phenyl or thiophenyl, which is substituted by $C_1$-$C_{18}$alkyl or $C_1$-$C_{18}$alkoxy; $C_1$-$C_{18}$alkyl;

$R'^{29}$ is as defined for $R^{29}$ except that $R'^{29}$ is not H.

5. Semiconductor device of claim 1, wherein the compound of the formula (I) conforms to the formula (IIa), (IIc), or (IIe) and the oligomer or polymer comprising repeating units of the formula (Ia) conforms to the formula (IIb), (IId), or (IIf)

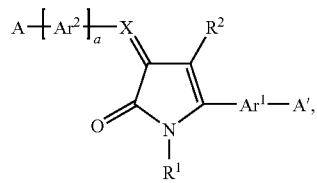
(IIa)

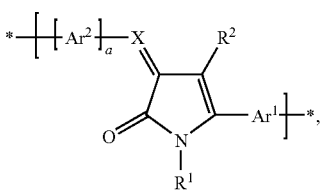
(IIb)

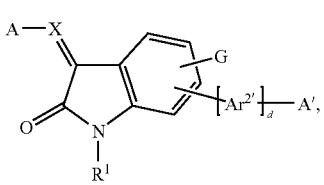
(IIc)

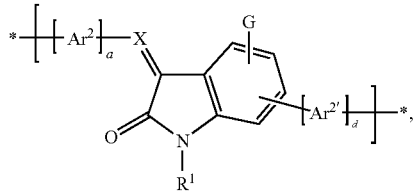
(IId)

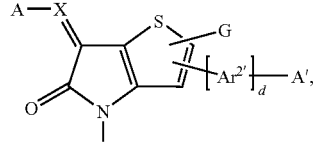
(IIe)

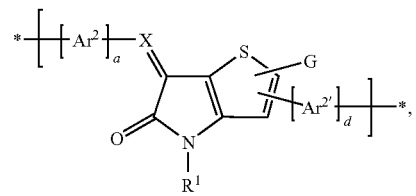
(IIf)

with symbols as defined in claim 1.

6. Semiconductor device of claim 1, wherein the oligomer or polymer comprising repeating units of the formula (Ia) conforms to the formula (IIIa) or (IIIb)

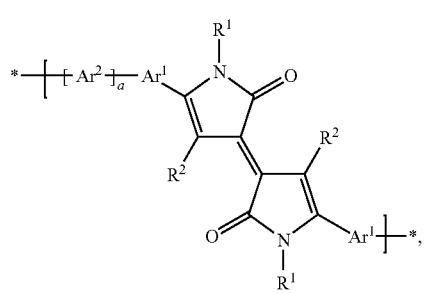
(IIIa)

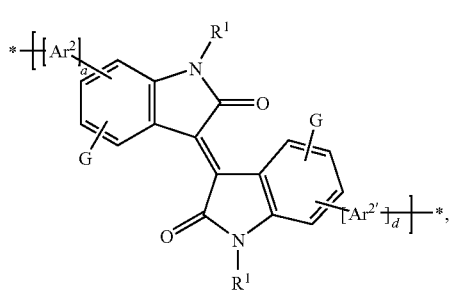
(IIIb)

with symbols as defined in claim 1.

7. Semiconductor device according to claim 1, wherein the layer comprises an oligomer or polymer comprising repeating units of formula (Ia), (IIb), (IId) and/or (IIIb),

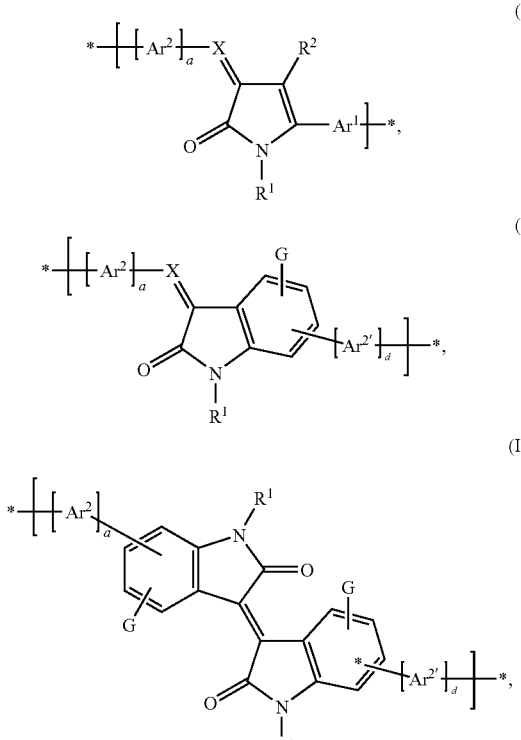

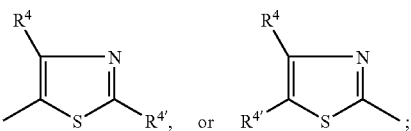

where p stands for 0, 1, 2, or 3;

$R^3$ may be the same or different within one group and is selected from $C_1$-$C_{18}$alkyl, $C_1$-$C_{18}$alkoxy, each of which may be substituted by E; or is —CO—$R^{28}$; or two or more groups $R^3$ which are in the neighbourhood to each other, form an annelated, 5 or 6 membered carbocyclic ring;

$R^4$, $R^{4'}$ and $R^{4''}$ independently stand for hydrogen, $C_1$-$C_{25}$alkyl, which may optionally be substituted by E and/or, if containing 2 or more carbon atoms, interrupted by D; $C_1$-$C_{18}$alkoxy, which may optionally be substituted by E and/or, if containing 2 or more carbon atoms, interrupted by D; $C_7$-$C_{15}$phenylalkyl, wherein phenyl may optionally be substituted by G, or —CO—$R^{28}$.

8. An oligomer or polymer comprising at least 4 repeating units of the formula

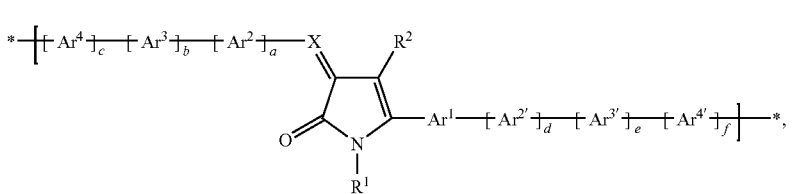

wherein the oligomer or polymer is a homooligomer or homopolymer, containing moieties A as end groups of the homooligomer or homopolymer chain, which end groups A, A' are independently selected from hydrogen; $C_1$-$C_{25}$alkyl or $C_2$-$C_{25}$alkenyl, each of which may optionally be substituted by E and/or in a C,C-single bond, if present, interrupted by D; $Ar^{10}$ or —$CR^5R^6$—$(CH_2)_j$—$Ar^{10}$;

where $R^5$ and $R^6$ independently from each other stand for hydrogen, fluoro, or $C_1$-$C_4$alkyl which can be substituted by fluoro, and $Ar^{10}$ stands for a group of formula

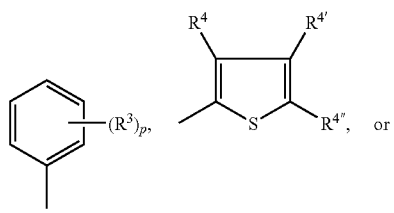

wherein a, b, c, d, e and f are from the range 0-3;

each of $R^1$, $R^2$ independently are selected from hydrogen; E; $C_1$-$C_{25}$alkyl, $C_2$-$C_{25}$alkenyl, $C_2$-$C_{24}$alkynyl, each of which may optionally be substituted by E and/or in any C,C-single bond, if present, interrupted by D; a cycloalkyl group, which can be substituted by E, one to three times by $C_1$-$C_8$alkyl, $C_1$-$C_8$thioalkoxy, or $C_1$-$C_8$alkoxy; or a cycloalkyl group, which can be condensed one or two times by unsubstituted phenyl or phenyl substituted by E, phenyl substituted one to three times by $C_1$-$C_4$-alkyl, halogen, nitro or cyano; a cycloalkenyl group; a ketone or aldehyde group; an ester group; a carbamoyl group; a silyl group; a siloxanyl group; $Ar^{10}$ or —$CR^5R^6$—$(C_jH_{2j})$—$Ar^{10}$, where j stands for 0, 1, 2, 3 or 4;

or $R^2$ and $Ar^1$, together with the vinyl moiety they are bonding to, form a ring such as an aryl or heteroaryl group, which may optionally be substituted by G;

X is CR where R is as defined for $R^1$, or is another keto-pyrrole moiety of the formula (Ib)

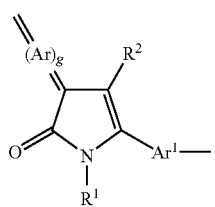

(Ib)

the index g is 0 or 1 and Ar, if present, is a tetravalent residue connected to the rest of the molecule by 2 chemical double bonds, and is selected from quinoid $C_6$-$C_{10}$ring systems, $=C_6H_4=$, and residues of the formula

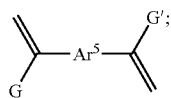

$Ar^1$, if not linked to $R^2$, and $Ar^2$, $Ar^{2'}$, $Ar^3$, $Ar^{3'}$, $Ar^4$, $Ar^{4'}$ and $Ar^5$ independently of each other are selected from divalent carbocyclic moieties of 5 to 15 carbon atoms, divalent heterocyclic moieties of 2 to 15 carbon and 1-8 heteroatoms selected from O, N, S, Si, each of said moieties containing conjugated or cross-conjugated double and/or triple bonds, or ethylenic or ethinic moieties, where each of these moieties is unsubstituted or substituted by E;

$R^5$ and $R^6$ independently from each other stand for hydrogen, fluorine, cyano or $C_1$-$C_4$alkyl, which can be substituted by fluorine, chlorine or bromine, or phenyl, which can be substituted one to three times with $C_1$-$C_4$alkyl, $Ar^{10}$ stands for aryl or heteroaryl, which may optionally be substituted by G, phenyl or 1- or 2-naphthyl which can be substituted one to three times with $C_1$-$C_8$alkyl, $C_1$-$C_8$thioalkoxy, and/or $C_1$-$C_8$alkoxy;

D is —CO—; —COO—; —S—; —SO—; —$SO_2$—; —OP(O)($OR^{29}$)O—; —OP(O)($R'^{29}$)O—; —O—; —$NR^{25}$—; —$CR^{23}$=$CR^{24}$—; or —C≡C—; and E is —$OR^{29}$; —$SR^{29}$; —$SOR^{29}$; —$SO_2R^{29}$; —$NR^{25}R^{26}$; —$COR^{28}$; —$COOR^{27}$; —$CONR^{25}R^{26}$; —CN; nitro; —OP(O)($OR^{29}$)$_2$; —OP(O)($R'^{29}$)$_2$; —Si($R'^{29}$)$_3$; or halogen;

G and G' independently are E; $C_1$-$C_{18}$alkyl, which may be interrupted by D; or $C_1$-$C_{18}$alkoxy which is substituted by E and/or, if containing 2 or more carbon atoms, interrupted by D, wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—;

$R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—;

$R'^{29}$ is as defined for $R^{29}$ except that $R'^{29}$ is not H;

or a tautomer of such a compound, oligomer or polymer.

9. Process for the preparation of an organic semiconductor device according to claim 1, which process comprises applying a solution and/or dispersion of a compound of the formula (I) or an oligomer or polymer comprising repeating units of the formula (Ia) in an organic solvent to a substrate and removing the solvent.

10. A semiconductor device according to claim 1, selected from the group consisting of a charge-transport, semiconducting, electric conducting, photoconducting, light emitting material, surface-modifying material, electrode material in batteries, alignment layer, OFET, IC, TFT, display, RFITD tag, electro- or photoluminescent device, backlight of display, photovoltaic or sensor device, charge injection layer, Schottky diode, memory device, planarising layer, antistatic, conductive substrate or pattern, photoconductor, or electrophotographic material comprising the compound of formula (I) or an oligomer or polymer comprising repeating units of the formula (Ia) according to claim 1.

* * * * *